United States Patent [19]
Kitamura et al.

[11] Patent Number: 5,480,048
[45] Date of Patent: Jan. 2, 1996

[54] MULTILAYER WIRING BOARD FABRICATING METHOD

[75] Inventors: Naoya Kitamura, Yokohama; Hisashi Sugiyama, Yokosuka; Yoshihide Yamaguchi, Fujisawa; Masayuki Kyoui, Yokohama; Hideyasu Murooka, Yokohama; Ryoji Iwamura, Yokohama; Makio Watanabe, Fujisawa, all of Japan

[73] Assignee: Hitachi, Ltd., Tokyo, Japan

[21] Appl. No.: 113,983

[22] Filed: Aug. 30, 1993

[30] Foreign Application Priority Data

Sep. 4, 1992 [JP] Japan .................. 4-236612

[51] Int. Cl.⁶ .................. B44C 1/22; B29C 37/00
[52] U.S. Cl. .................. 216/13; 216/38; 216/52
[58] Field of Search .................. 156/643, 646, 156/645, 655, 656, 668, 901, 902; 427/96, 97, 98; 264/104, 272.11, 272.14, 272.17; 216/13, 16–19, 38, 52, 56, 57, 58

[56] References Cited

U.S. PATENT DOCUMENTS 4,867,839  9/1989  Sato et al. .................. 156/902 X
5,118,385  6/1992  Kumak et al. .................. 156/644

FOREIGN PATENT DOCUMENTS

| 50-64767 | 6/1975 | Japan . |
| 57-50490 | 3/1982 | Japan . |
| 57-50491 | 3/1982 | Japan . |
| 57-50489 | 3/1982 | Japan . |
| 62-43544 | 9/1987 | Japan . |
| 4-148590 | 5/1992 | Japan . |
| 4-38158  | 6/1992 | Japan . |
| 4-38157  | 6/1992 | Japan . |
| 4-168794 | 6/1992 | Japan . |

Primary Examiner—William Powell
Attorney, Agent, or Firm—Fay, Sharpe, Beall, Fagan, Minnich & McKee

[57] ABSTRACT

A multilayer wiring board fabricating method and a multilayer wiring board fabricated with use of the method that a solvent-free fluid polymer precursor is put on a wiring layer of a base substrate, and space among the wirings is exhausted and is filled with the precursor, and the precursor is hardened under a hydrostatic pressure and then the next wiring layer is formed before the above process is repeated one or more times. The multilayer wiring board fabricating method is excellent in the mass productivity and low cost and in that the wiring can be made highly dense with the substrate having vertical via conductors for connection among the conductor layers.

55 Claims, 15 Drawing Sheets

MULTILAYER WIRING BOARD FABRICATING METHOD

BACKGROUND OF THE INVENTION

The present invention relates to a multilayer wiring board fabricating method and multilayer wiring board fabricated with use of the method. More particularly, it concerns a high-density, highly reliable multilayer wiring board and a multitip module board for use in a main frame computer, a workstation, a multimedia computer, and an ATM exchanger for communication and their fabricating method.

Hitherto multilayer wiring boards for use in such purposes have ordinarily an organic polymer layer for at least parts of an insulation layer thereof. The previous boards contains much pinholes and voids in the organic polymer layer, are different in the characteristics in a central area and a circumference of the organic polymer layer, and involve a problem of its adhesion with an undercoat film. Thus, the hitherto boards are low in the yield in its fabrication process and not sufficiently high in its wiring density.

The hitherto techniques are described below by reference to the accompanying drawings.

The following describes a method of fabricating a hitherto multilayer wiring board having a ceramic wiring board used as a base substrate by reference to process step chart in FIGS. 14a to 14g.

As shown in FIG. 14a, a substrate 1401 has a metallic undercoat layer 1402 formed for use as an electrode available for plating on an entire upper surface thereof. As shown in FIG. 14b, on the upper surface is formed a resist 1403 having grooves formed to a desired conductor pattern shape. After this, the metallic undercoat layer 1402 on exposed portions 1404 of the grooves is electroplated as a cathode. The groove portions 1404 of the resist 1403, as shown in FIG. 14c, are selectively filled with conductor to form conductors 1405 for wires, vias, grounds, and power supplies. In turn, as shown in FIG. 14d, the resist 1403 is removed to expose the conductors 1405. Then, as shown in FIG. 14e, the metallic undercoat layer 1402 other than the portions contacting the conductor 1405 is removed. In turn, as shown in FIG. 14f, a polymer insulation layer 1406 is formed so as to enclose the conductor 1405 on the entire surface of the substrate 1401. Then, as shown in FIG. 14g, an upper surface of the conductor 1405 is exposed by grinding or a similar process and at the same time, a surface of the insulation layer 1406 is polished. The process steps described above are repeated a few times as necessary to fabricate the multilayer wiring board. The above-described technique for forming the conductor pattern was disclosed in the Japanese Patent Application Laid-Open Nos. 57-50489, 57-50490, and 57-50491. The above-described technique for forming the insulation layer was disclosed in the Japanese Patent Application Laid-Open No. 50-64767.

Also, the following describes a method of fabricating another hitherto multilayer wiring board by reference to process step chart in FIGS. 15a to 15g.

As shown in FIGS. 15a and 15b, a substrate 1501 has a first conductor layer 1502 and a second conductor layer 1503 as a contact post formed thereon. These layers have an epoxy resin or polyimide 1504 in a B-stage stuck on surfaces thereof as shown in FIG. 15c. In turn, as shown in FIG. 15d, these resin layers are hardened while being vertically pressed to form a planar insulation layer 1506 having the surface 1505 exposed as the contact post. In turn, as shown in FIG. 15c, a third conductor layer 1507 is formed in connection with the contact post exposed on the insulation layer to form the multilayer wiring board. The above-described technique for forming the multilayer wiring board the conductor pattern was disclosed in the Japanese Patent Publication Nos. 4-38157 and 4-38158.

Note that in general, the metallic undercoat which is necessary for forming the wiring layers is formed in a dry filming method, such as the sputtering process or evaporation process, as in described in the Japanese Patent Application Laid-Open Nos. 57-50489, 57-50490, and 57-50491.

Further, there is a known method of fabricating still another previous multilayer wiring board with a photosensitive insulating material, such as a photosensitive polyimide, in a simpler process than the above-described two hitherto techniques, although a diameter of a via is generally larger. An example was disclosed in the Japanese Patent Publication No. 62-43544.

On the other hand, the following describes an example of structure of a hitherto multilayer wiring board having a printed wiring board used as a base substrate by reference to FIG. 16.

A method of fabricating this multilayer wiring board is based on a way similar to the hitherto one of fabricating the multilayer wiring board having the photosensitive polyimide used therein. The board, however, can be made to have a higher density than the hitherto one having plated through-holes used to make inter-layer connections. The method of fabricating the multilayer wiring board basically includes a process that the printed wiring board having a patterning made on a surface conductor thereof is treated to have a photosensitive insulating material filmed on a surface layer thereof. Via holes are formed by exposure and development. In turn, a conductor is formed on an entire surface before being patterned. Further, the process is repeated to form a multilayer. Finally, plated through-holes are formed. The above-described method of fabricating the multilayer wiring board is called the build-up process. In this method, as shown in FIG. 16, connections of a printed wiring board surface-layer conductor 1600 with a build-up conductor layer 1601 and of the build-up conductor layers together are not made by a plated through-hole 1602 through drilling, but by a conformal via 1603. The multilayer wiring board, thus, can be made denser than the printed wiring board having the surface-layer connection made only by the usual plated through-hole. Forming the metallic undercoat needed for forming the wiring layers is usually made by electroless plating. An example of the build-up process is given in the Japanese Patent Application Laid-Open No. 4-148590.

Further, as shown in FIG. 17, the Japanese Patent Application Laid-Open No. 4-168794 disclosed an example of method of fabricating a multilayer printed wiring board which can effectively use areas of plated through-holes in the way that plated through-holes formed for inter-layer connections by drilling are filled with a resin before conductor pads to be connected with the plated through-holes are formed on their tops.

In FIG. 17 are indicated a printed wiring board 1701, conductor layers 1702, 1703, 1704, and 1705, and the plated through-hole 1706.

A first difficult problem of the previous techniques is in a insulation film forming step and a planarization step.

In the insulation film forming step shown in FIG. 14f and the planarization step in FIG. 14g, a polyimide usually used as the polymer for forming the insulation layer 1406 tends to have pinholes and voids as its solvent and moisture are evaporated by a thermal hardening reaction. The polyimide shrinks along irregularity of the undercoat, the insulation film is formed along the irregularity of the substrate, resulting in adversely deficient planarization. Therefore, the soft polyimide and the hard metallic conductor have to be ground and polished to make a sufficient planarization. This process takes a long time. Also, it is not easy to remove the foreign matters of ground powder and polished powder through cleaning. Further, as the polyimide insulation film is obtained from polyamic acid solution or polyimide solution by being coated and heated, a required film thickness cannot be obtained at a time. More times of coatings and heatings have to be made. Still further, hardening the polyimide takes a high temperature and a long time. With such a number of problems, this hitherto method of fabricating the multilayer wiring board is defective in low yield, many number of process steps, long lead time, and very low mass productivity.

In the hitherto technique shown in FIGS. 15a to 15e, the polyamic acid solution or the epoxy resin solution in FIG. 15c is coated before the solvent is vaporized to stick the epoxy resin or polyamic acid to the wiring layer. Vaporization of the remaining solvent in hardening, then, causes voids and pinholes. Also, vaporization of the condensed water due to hardening of the polyamic acid causes voids and pinholes. Further, even if coating is made without solvent, air is involved in between the wiring layers 1502 and 1503 and the insulation layer 1504, causing gaps and bubbles to remain. These also cause voids and pinholes. These defects in the insulation film do not only make it difficult to form the upper wiring layer, but also fetches into the insulation film the process solution in the wet process in plating and etching for forming the wiring. This causes insulation failure. To proceed with hitherto technique shown in FIGS. 15a to 15e, we must use epoxy resin without solvent or a polyimide resin without solvent which is very low in viscosity. If such a material is used, however, the wiring is strongly pressed to the mold, causing wiring deformation and breaking. If the viscosity is made higher, the resin cannot only be filled in between the wirings, but also the wiring has a thick resin remained on the upper surface thereof. In addition, as the pressure is only compression, it is not uniformly applied to the resin. This results in that a central portion of the insulation layer having higher pressure and a circumferential portion of the insulation layer having lower pressure have different in the physical properties, including the heat resistance, the thermal expansion coefficient, and the mechanical strength. Also, the resin leaks off the substrate. Further, a film thickness of the circumferential portion of the insulation layer is made thinner. Still further, the air involved in the leaking, the air dissolved in the resin, and the evaporation of moisture cause voids and pinholes on the circumferential portion of the insulation layer. Still further, the mere compressing pressure causes remaining of thin film of around 1 μm thick on the upper surface of the wiring. The remaining thin film cannot be ignored. With such many problems, this hitherto method of fabricating the multilayer wiring board is defective in low yield.

A second difficult problem of the hitherto techniques is in a adhesive strength of the wiring conductor with the insulation film in forming the next wiring layer after the insulation film was formed. In general, forming a conductive undercoat film for electroless plating or electroplating is made in a dry filming method, such as the sputtering process or evaporation process, as in described in the Japanese Patent Application Laid-Open Nos. 57-50489, 57-50490, and 57-50491. The sputtering process provides a relatively high adhesive strength as the conductive undercoat film is physically dug in the insulation film. On the other hand, as the evaporation process does not have such an effect, its adhesive strength is inferior to that of the sputtering process. However, as the sputtering process and the evaporation process need expensive apparatuses and take a long filming time, they cannot be said as low-cost, high-through-put processes. An electroless plating process is often used in fabrication of the printed wiring board. In the electroless plating process, the surface of the insulation film is subjected to etching to have an irregularity depending on the intensity of the etching. An adhesive strength of the insulation film with the conductive undercoat film is maintained by an anchor effect of the irregularity. The electroless plating process provides a relatively high adhesive strength. However, composition of the insulating material has to be highly elaborated to make the etching contrast. That is, the composition has to contain a constituent which is likely etched and a constituent which is hard to etch. It therefore is in a trade-off relationship with the physical properties, such as the heat resistance and the mechanical properties. Also, it is hard to stably form a constant rough surface and thus difficult to stably maintain the adhesive strength.

On the other hand, the build-up process for the printed wiring board has a diameter of a bottom of the conformal via 1603 limited to 100 μm in view of a resolution of the photosensitive insulating material, such as a photosensitive epoxy material. To prevent the conductor from breaking down, further, the conformal via has to be shaped to taper. Thus, the surface area occupied by the via including the land is too wide to made the via diameter narrower to make the density higher. As the conformal via has an irregularity formed on the upper surface thereof, also, the next conformal via or wiring conductor cannot be formed on that. This means that vias at two positions are used for connection of separated thin-film multilayer wiring layers. This results in that the number of vias is lost. Also, a thermal via which is a heat conductor via for heat radiation cannot be formed. Further, the conductor has to have a wider cross-section because of its wiring resistance. Forming a square pattern of a thick conductor is superior to form a finer pattern to forming a rectangular pattern of a thin conductor. Notwithstanding, if the conductor is made thick to make patterning by etching after the conductor is formed, the finer wiring pattern cannot be formed. On the other hand, as the connection with the inner conductor layer of the printed wiring board or the connection of the both surfaces of the printed wiring board is made with the plated through-hole 1602 formed at the final stage. This is defective because the plated through-hole decreases the wiring density. Also, the printed wiring board having the plated through-hole formed by drilling and non-filled cannot have a liquid-like material, such as the photosensitive insulation material or resist, formed to film. The build-up process, therefore, cannot form the thin-film multilayer wiring layers. Further, as shown in FIG. 17, in the Japanese Patent Application Laid-Open No. 4-168794 can effectively use the areas of plated through-holes in the way that the plated through-holes formed for the inter-layer connections by drilling are filled with the resin before the conductor pads to be connected with the plated through-holes are formed on their tops. The laid-open is effective for connection of the two sets of the adjoining conductor layers 1702 and 1703, 1704 and 1705 of the multilayer printed wiring board. However, the connection of the both surfaces of the printed wiring layers or two separated conductor layers has to unavoidably depend on the plated through-hole 1706 formed at the final stage. The finished multilayer printed wiring board has the non-filled plated through-hole left thereon.

Note that a multilayer wiring board fabricating method with use of a fluid polymer precursor into is described to some extent in the U.S. patent application Ser. No. 07/672, 117, filed Mar. 19, 1991, now abandoned, and its continuation-in-part application Ser. No. 08/037,543, file Mar. 22, 1993, now U.S. Pat. No. 5,300,735, both of which have not been issued at present.

SUMMARY OF THE INVENTION

In view of the foregoing, it is an object of the present invention to solve the above-described problems and to provide a new method of fabricating a high-density multilayer wiring board having a high yield, a decreases number of process steps, a short lead time, the increased reliability, the high yield, a high mass productivity, and a low production cost. A second object of the present invention is to modify the method to a process applicable from a ceramic wiring board to a printed wiring board as base substrates. A third object of the present invention is to make the printed wiring board free of an effect due to plated through-holes and to provide a new method of fabricating a thin-film multilayer wiring board and a structure having higher density wiring than the build-up process.

Briefly, the foregoing objects are accomplished in accordance with aspects of the present invention by a method of fabricating a multilayer wiring board. The method comprises step 1 of forming a base substrate having at least one of a horizontal wiring conductor and a vertical via conductor as wiring layers on at least one of surfaces thereof; step 2 of putting a mold having a planar surface on a wiring layer side of the base substrate and supplying a solvent-free fluid polymer precursor into between the base substrate and the mold; step 3 of exhausting between the mold and the base substrate; step 4 of moving the mold toward the base substrate before filling gaps between at least adjacent ones of the conductors on the base substrate and if necessary, through-holes of the printed wiring board with the solvent-free fluid polymer precursor; step 5 of applying a predetermined hydrostatic pressure to the solvent-free fluid polymer precursor; step 6 of hardening the solvent-free fluid polymer precursor at the predetermined hydrostatic pressure; step 7 of exposing an upper surface of the horizontal wiring conductor or the vertical via conductor; and step 8 of forming a wiring layer comprising at least one of another horizontal wiring conductor and another vertical via conductor connected with the horizontal wiring conductor and the vertical via conductor; if necessary the steps 2 to 8 are repeated at least once. In such a way, we can obtain the multilayer wiring board of desired number of layers.

By fabrication of the multilayer wiring board with use of the above-described fabrication method, we can obtain the multilayer wiring board of the structure that multilayer conductors are electrically connected together through the vertical via conductor. A degree of freedom of the wiring patterning can be increased, and the wiring can be made highly dense. Note that the vertical via conductor can be formed also on the conductor layer for the filled through-hole.

DETAILED DESCRIPTION OF THE INVENTION

Figure 1A:
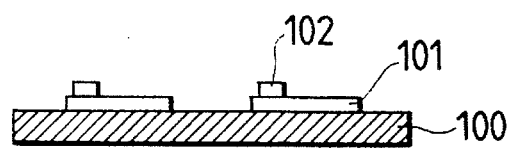
FIGS. 1a, 1b, 1c, 1d, 1e, 1f, 1g, and 1h depict cross-sectioned views illustrating fabrication process steps for a multilayer wiring board in an embodiment of the present invention.
Figure 1B:
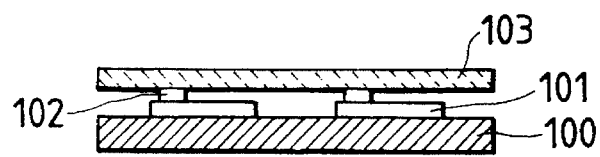
Figure 1C:
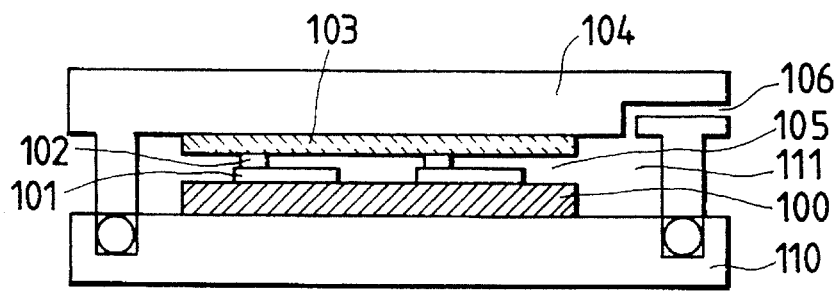
Figure 1D:
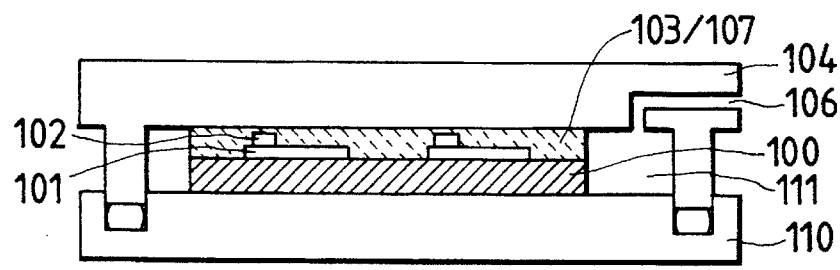
Figure 1E:
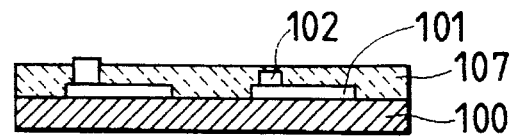
Figure 1F:
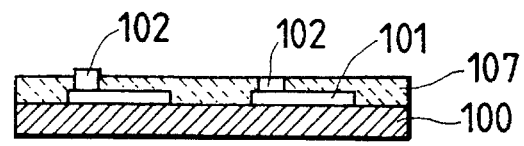
Figure 1G:
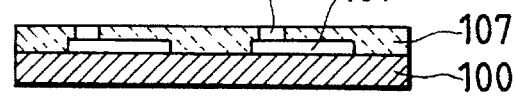
Figure 1H:
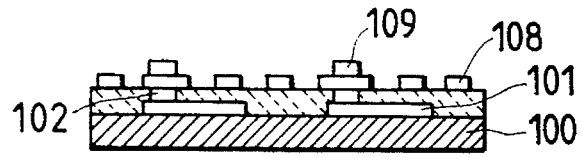

The method of fabricating the multilayer wiring board of the present invention comprises step 1 of forming a base substrate 100 having at least one of a horizontal wiring conductor 101 and a vertical via conductor 102 as wiring layers on at least one of surfaces thereof as shown in FIG. 1a; step 2 of putting a mold 104 having a planar surface on a wiring layer side of the base substrate 100 aligned on a mold 110 and supplying a solvent-free fluid polymer precursor 103 into between the base substrate 100 and the mold 104 as shown in FIGS. 1b and 1c; step 3 of exhausting a space 111 of the mold 104 and 110 having an exhausting port 106, particularly exhausting a space 105 between the mold 104 and the base substrate 100 from the exhausting port 106; step 4 of moving the mold 104 toward the base substrate 100 before filling gaps between at least adjacent ones of the conductors on the base substrate 100 and if necessary, through-holes of the printed wiring board with the solvent-free fluid polymer precursor 103 as shown in FIG. 1d; step 5 of applying a predetermined hydrostatic pressure to the solvent-free fluid polymer precursor 103; step 6 of hardening the solvent-free fluid polymer precursor 103 at the predetermined hydrostatic pressure to an insulation film 107; step 7 of exposing an upper surface of the horizontal wiring conductor 101 or the vertical via conductor 102 as shown in FIGS. 1e, 1f, and 1g; and step 8 of forming a wiring layer comprising at least one of another horizontal wiring conductor 108 and another vertical via conductor 109 connected with the horizontal wiring conductor 101 and the vertical via conductor 102 as shown in FIG. 1h; if necessary the steps 2 to 8 are repeated at least once to make a multilayer.

FIGS. 1a to 1h shows that the pair of horizontal wiring conductor 101 and vertical via conductor 102 exists. Alternatively, only the horizontal wiring conductor 101 may exist on the base substrate 100 or only the vertical via conductor 102 may exist on the base substrate 100. Alternatively, only the horizontal wiring conductor 108 or only the vertical via conductor 109 may be formed. FIGS. 1a to 1h are an example in which the base substrate 100 has the horizontal wiring conductor 101 and the vertical via conductor 102 formed on one side thereof and has the multilayer wirings formed on the other side thereof. Alternatively, the base substrate 100 can have the multilayer wirings laminated on the both sides thereof at the same time in the method described above. The simultaneous forming the multilayer wirings on the both sides can prevent a warp of the base substrate 100 due to the hardening shrinkage in forming the insulation film 107 and a difference of thermal expansion coefficients of the insulation film 107 and the base substrate 100 in cooling from a hardening temperature. Also, the simultaneous forming further increase the wiring density of the multilayer wiring board. Further, the simultaneous forming decreases a number of process steps and shorten the lead time.

The base substrate 100 may or may not contain the wiring conductors. The insulating material may be any of organic insulating materials, like the printed wiring board and metal cored wiring boards having a metallic core in an insulation plate to improve its strength, thermal conductivity, electro-magnetic shielding, and thermal expansion coefficient and inorganic insulating material including ceramic wiring board. The conductors should be preferably made of copper particularly for the thin-film layers in view of the wiring resistance. The conductors may be made of tungsten and the like for the base substrate, but not limited to the copper.

FIGS. 2a to 2i show an example of the base substrate.

Figure 2A:
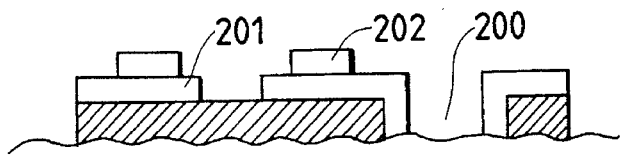
FIGS. 2a, 2b, 2c, 2d, 2e, 2f, 2g, 2h and 2i depict cross-sectioned views illustrating some examples of base substrates for use in the present invention.
Figure 2B:
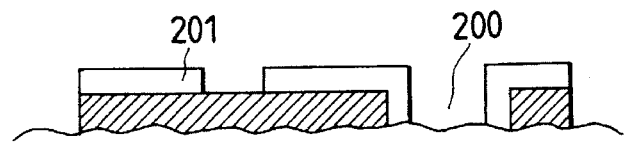
Figure 2C:
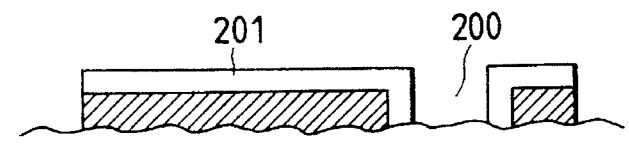
Figure 2D:
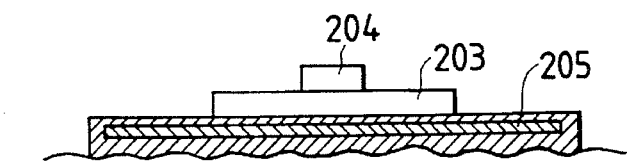
Figure 2E:
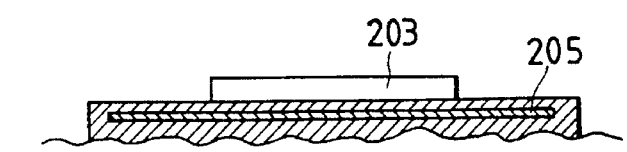
Figure 2F:
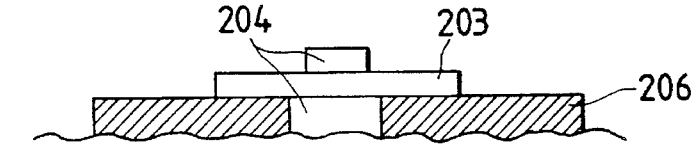
Figure 2G:
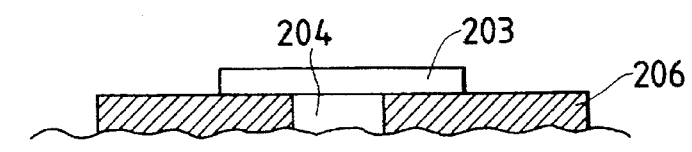
Figure 2H:
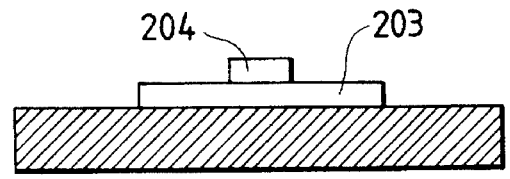

FIG. 2a is an example of the printed wiring board having a plated through-hole 200 with a surface-layer conductor 201 patterned thereon and having a via conductor 202 to be connected a conductor of the plated through-hole 200 and/or a desired position of the surface-layer conductor 201. FIG. 2b is another example of the printed wiring board having a plated through-hole 200 with a surface-layer conductor 201 patterned thereon. FIG. 2c is still another example of the printed wiring board having a plated through-hole 200 with surface-layer conductor 201 before patterned thereon. FIGS. 2d and 2e are examples of the metal cored wiring board having a metallic core 205. FIGS. 2f and 2g are examples of the ceramic wiring board having a ceramic plate 206. In some description below, the base substrate is represented by a structure in FIG. 2h for simplicity of explanation.

In FIGS. 2d to 2h are indicated a horizontal wiring conductor 203 and a vertical via conductor 204.

Figure 2I:
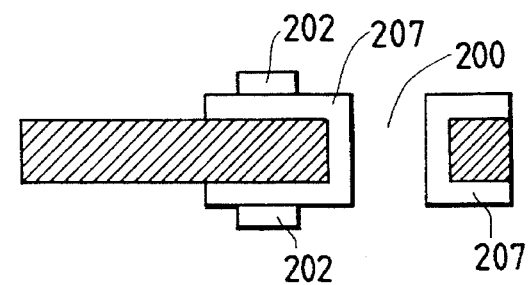

FIG. 2i is an example of the base substrate for bilateral wiring having a plated through-hole 200 with a via conductor 202 provided on a land 207 of the plated through-hole 200.

FIGS. 3a to 3g show an example of fabrication of the printed wiring board in FIG. 2a.

Figure 3A:
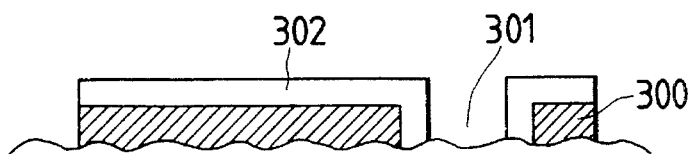
FIGS. 3a, 3b, 3c, 3d, 3e, 3f, and 3g depict cross-sectioned views illustrating fabrication process steps for multilayer wiring board in another embodiment of the present invention.
Figure 3B:
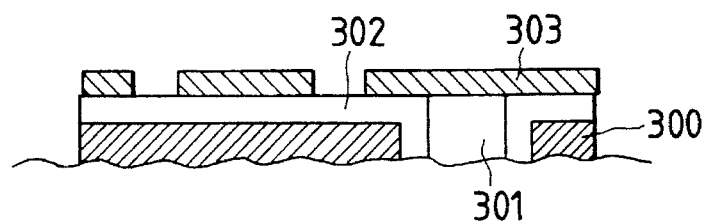
Figure 3C:
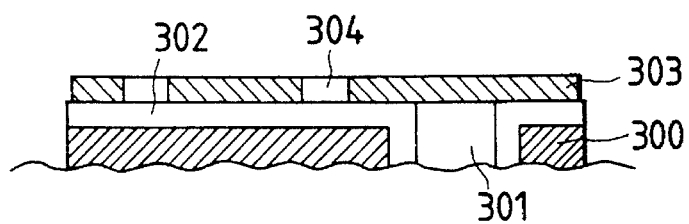
Figure 3D:
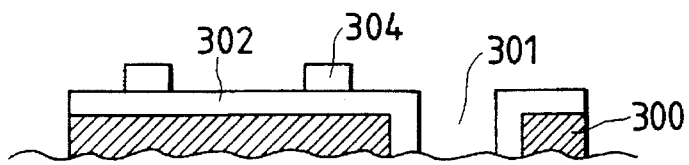
Figure 3E:
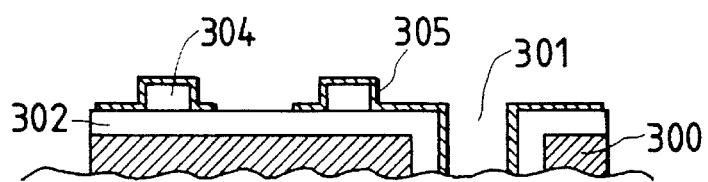
Figure 3F:
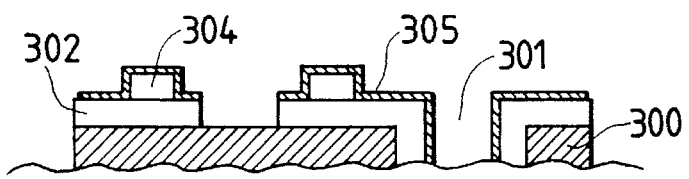
Figure 3G:
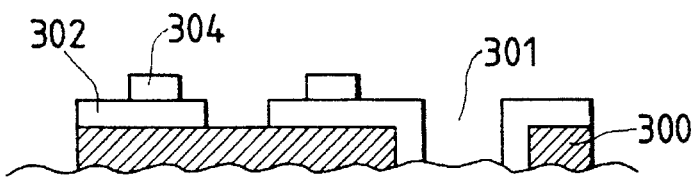

The printed wiring board 300 having a plated through-hole 301 and a surface-layer conductor 302 having no patterning as shown in FIG. 3a fabricated by a process including a step of forming a positive pattern of a resist 303 at a desired position as shown in FIG. 3b; a step of filling the positive pattern of the resist with the via conductor 304 as shown in FIG. 3c before removal of the resist 303 as shown in FIG. 3d; a step of forming a negative pattern of a resist 305 at a desired position as shown in FIG. 3e; and a step of patterning the surface-layer conductor 302 to a desired shape by etching as shown in FIG. 3f before removal of the resist as shown in FIG. 3g. Alternatively, on the contrary, the surface-layer conductor 302 may be patterned first before the via conductor 304 is formed.

Figure 4A:
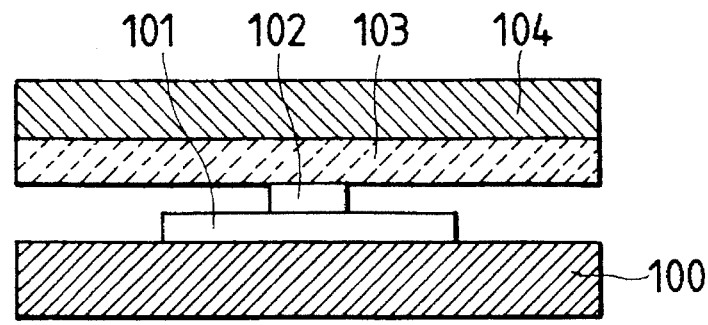
FIGS. 4a, 4b, and 4c depict cross-sectioned views illustrating some examples of supply form of solvent-free fluid polymer precursor for use in the present invention.
Figure 4B:
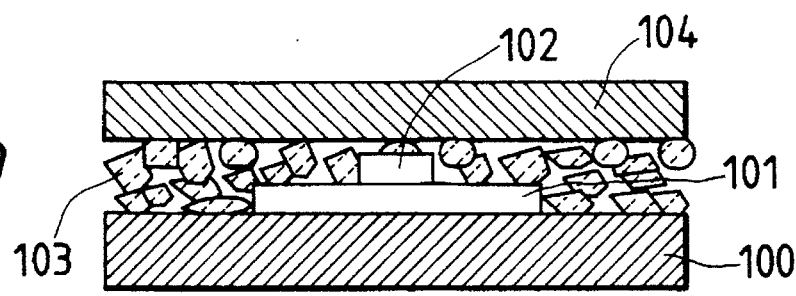
Figure 4C:
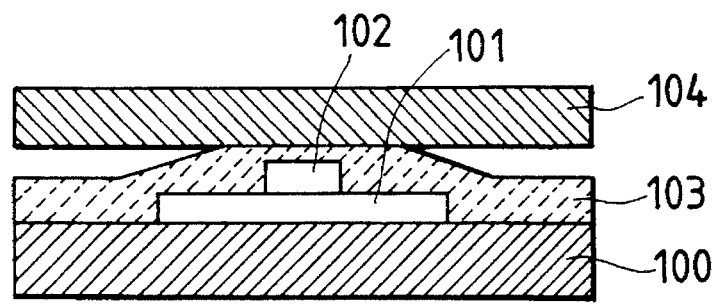

FIGS. 4a to 4c show a supply form of the solvent-free fluid polymer precursor 103. References in FIGS. 4a to 4c identical with those in FIGS. 1a to 1h are indicated by the same numerals.

The supply form is any of a film-like, a membrane-like coated in the mold 104 or on a simple flat plate as shown in FIG. 4a, a powder-like as shown in FIG. 4b, and a membrane-like matter coated on at least the wiring layer on the base substrate 100. The supply form is preferably the film-like, powder-like, or the membrane-like coated in the mold on the simple flat plate in view of the exhaustion from the space 105 among the wirings mentioned above or a closed space 111 (FIG. 1c). The supply form is preferably the film-like in view of the mass productivity and a cleanliness at site. The film-like precursor can be prepared, for example, in a way that the precursor is dissolved in a solvent, the precursor solution is coated on a fluoropolymer sheet, and the solvent is vaporized by baking. Alternatively, the film-like precursor can be prepared in a way that the precursor is melted to stick without solvent. An available coating process can be any of spin coating, roll coating, and curtain coating. The fluoropolymer sheet can be replaced by the mold or the simple flat plate or the base substrate having the wiring layer formed thereon to form a film of the precursor on the base substrate. The powder-like powder should have a particle size of 0.1 to 1000 µm, and can be sprayed to the base substrate having the wiring layer formed thereon or the mold or the simple flat plate. In any case, an amount of the precursor to be filled in should be physically sufficient to have no non-filled portions if the precursor is filled in gaps among conductors on the base substrate. The amount can be decided by a simple experiment.

The space 105 between the mold 104 and the base substrate 100 has to be exhausted from the exhausting port 106 as shown in FIG. 1c before the solvent-free fluid polymer precursor 103 is aligned and filled in among the conductors. The then degree of vacuum should be preferably not higher than 20 torr. The exhaustion is needed to remove the air from the gaps among the wiring conductors and from the plated through-hole, not no form any gap between the solvent-free fluid polymer precursor 103 and the conductors, not to take any external air causing bubbles into the solvent-free fluid polymer precursor 103, and to remove the bubbles, moisture, and solvent already existing in the solvent-free fluid polymer precursor 103.

If the mold 104 is moved toward the base substrate 100 to fill in among the conductors with the solvent-free fluid polymer precursor 103 as shown in FIG. 1d, the solvent-free fluid polymer precursor 103 has to be heated to melt or soften depending on the viscosity thereof, particularly in a high viscosity. The solvent-free fluid polymer precursor 103 can be likely filled as its viscosity is low. Also, removing the bubbles, moisture, and solvent from the precursor 103 can be effective as its viscosity is low.

Moving the mold 104 toward the base substrate 100 can be made by reducing a pressure in the space 105 between the mold 104 and the base substrate 100. Further, for example, an external gas compression pressure can be vertically applied to them. The compression pressure should be not higher than 30 kgf/cm$^2$, preferably not higher than 20 kgf/cm$^2$, more preferably not higher than 10 kgf/cm$^2$. With the mold 104 moved toward the base substrate 100, the base substrate 100 having the wiring layer formed of the horizontal wiring conductor 101 and the vertical via conductor 102 is filled with the solvent-free fluid polymer precursor 103 thereon. Then, the planar surface of the mold 104 to the wiring side is stopped on the upper surface of the wiring layer. If the vertical compression pressure is too high, the wiring conductor may be broken or destructed.

In turn, the exhaustion is stopped to return the space 105 to the atmospheric pressure. The precursor 103 filled in the gaps among the wiring conductors, then, has to have a hydrostatic pressure applied thereto. The hydrostatic pressure should be made of a vertical compression pressure and a horizontal pressure. The horizontal pressure should be made of an inert gas, such as air or nitrogen, applied from the exhausting port 106. The hydrostatic pressure should be preferably not higher than 20 kgf/cm$^2$, more preferably not higher than 10 kgf/cm$^2$. Further, the hydrostatic pressure should be usually made virtually uniform to the precursor 103. In the present invention, the vertical compression pressure should be made higher than or equal to the horizontal pressure not to lift the mold up. If the vertical compression pressure should be made higher than the horizontal pressure, the mold 104 is further moved toward the wiring layer on the base substrate 100. A difference of the vertical compression pressure from the horizontal pressure should be not higher than 10 kgf/cm$^2$, preferably not higher than 5 kgf/cm$^2$, more preferably not higher than 1 kgf/cm$^2$. If the pressure difference is too high, the wiring conductor may be broken or destructed. The hydrostatic pressure applied to the precursor 103 filled in the gaps among the wiring conductors can crush the bubbles in the precursor 103 and can suppress vaporization of the moisture, the dissolved air, and the solvent repress generation of voids. Further, the virtually uniform pressure to the precursor 103 can prevent the precursor 103 from leaking out of the base substrate so that the entire base substrate can have a planar, uniformly thick layer of the precursor 103 formed thereon.

To thermally harden the solvent-free fluid polymer precursor 103 filled in the gaps among the wiring conductors, the precursor 103 should be hardened while having the hydrostatic pressure applied thereto in the mold as described above. The hydrostatic pressure applied to the precursor 103 can crush the bubbles in the precursor 103 and can suppress vaporization of the moisture, the dissolved air, and the solvent repress generation of voids. Further, the virtually uniform pressure to the precursor 103 can prevent the precursor 103 from leaking out of the base substrate so that the entire base substrate can have a planar, uniformly thick layer of the precursor 103 formed thereon. Still further, the insulation film 107 can be made of uniform physical properties, including the heat resistance, the thermal expansion coefficient, and the mechanical strength. Still further, the hardening temperature can be set to two or more stages, and it can be successively raised to improve the physical properties of the insulation film. If the hardening is made at a first stage once, no hydrostatic pressure application is needed. After the multilayer wiring board is released from the mold, hardening can be further made.

The multilayer wiring board formed in the process described above, as shown in FIG. 1e, there may be some conductors the upper surfaces of which are exposed and the other conductors the upper surfaces of which are not exposed. One reason is that the surface of the mold 104 cannot be completely made flat. Another reason is that the surface of the mold 104 is not stopped at a proper position. The reason is that the height of the wiring layer cannot be made completely uniform. For the reasons, as shown in FIG. 1f, the upper surface of the conductor covered with the insulation film 107 has to be exposed by wet etching or dry etching. The wet etching to be used is preferably a solution of potassium permanganate, more preferably a solution of chromate, further more preferably a alkaline aqueous solution of potassium permanganate which cannot dissolve the conductor. The dry etching to be used is preferably the O$_2$ plasma or a UV/ozone etching. The etching can uniformly etch back the insulation film 107. The surface of the etched insulation film has the adhesive strength with the conductors maintained. Further, the precursor 103 should not be completely hardened, but etching should be made before the precursor 103 should be completely hardened to increase the adhesive strength. Still Further, if the heights of the exposed upper surfaces of the conductors are too much different as shown in FIG. 1f, the upper surfaces can be polished to uniform height by mechanical polishing or chemical polishing. As the polishing is made only on the upper surfaces of the conductors and as a polishing amount is a little, it is not hard work, unlike the previous technique which takes long time.

The following describes in detail the methods of forming the wiring layer comprising at least one of another horizontal wiring conductor and another vertical via conductor connected with the horizontal wiring conductor and the vertical via conductor.

Figure 5A:
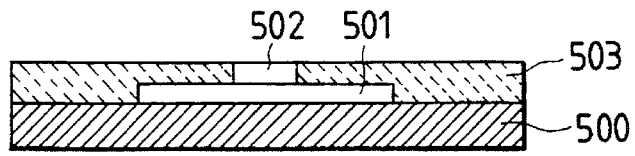
FIGS. 5a, 5b, 5c, 5d, 5e, 5f, 5g, and 5h depict cross-sectioned views illustrating process steps of forming a wiring layer in an embodiment of the present invention.
Figure 5B:
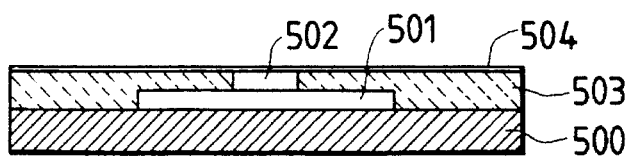
Figure 5C:
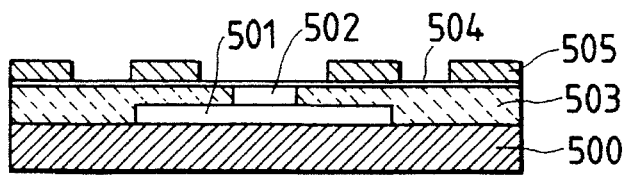
Figure 5D:
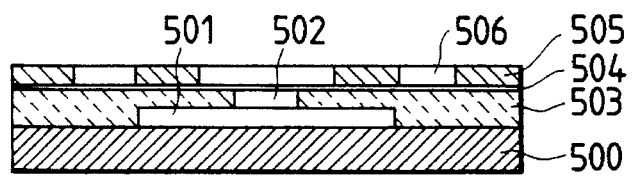
Figure 5E:
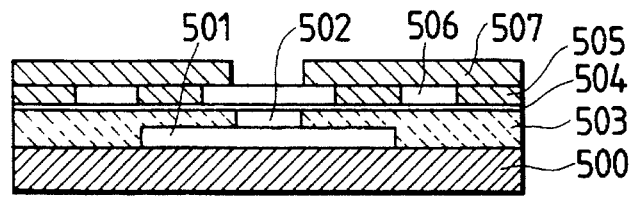
Figure 5F:
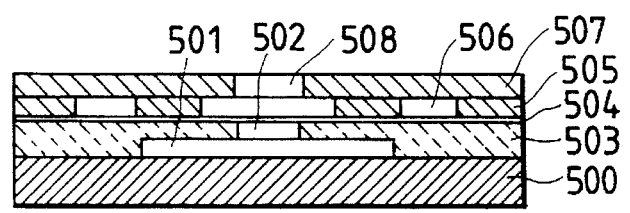
Figure 5G:
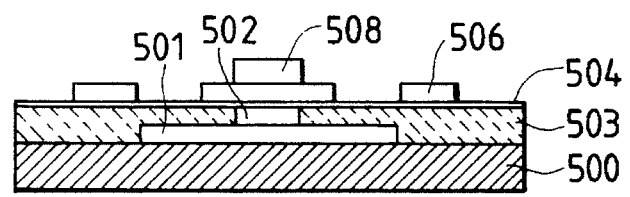
Figure 5H:
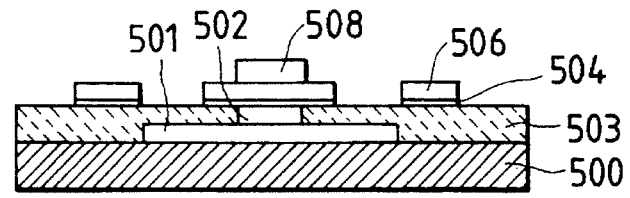

A first method includes a step of forming a conductive undercoat film 504 for electroplating or electroless plating for connection with the vertical via conductor 502 of the base substrate 500 as shown in FIGS. 5a and 5b; a step of forming a positive pattern of a resist 505 for the horizontal wiring conductor at a desired position on the conductive undercoat film 504 as shown in FIG. 5c; a step of filling the positive pattern of the resist with the horizontal wiring conductor 506 as shown in FIG. 5d; a step of forming a positive pattern of a resist 507 for the vertical via conductor at a desired position on the horizontal wiring conductor 506 as shown in FIG. 5e; a step of filling the positive pattern of the resist with the vertical via conductor 508 as shown in FIG. 5f; a step of removal of the two resist layers 505 and 507 as shown in FIG. 5g; and a step of etching unnecessary portions of the conductive undercoat film 504 as shown in FIG. 5h. This first method can form a pair of the horizontal wiring conductor and the vertical via conductor. Numerals 501 and 503 in FIG. 5 indicate the horizontal wiring conductor and the insulation film, respectively.

Figure 6A:
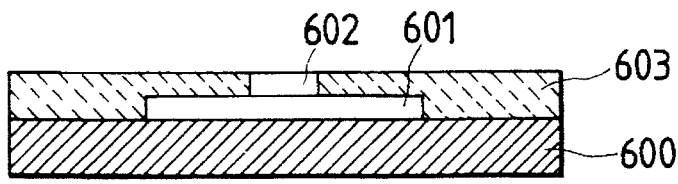
FIGS. 6a, 6b, 6c, 6d, 6e, and 6f depict cross-sectioned views illustrating process steps of forming an uppermost wiring layer in an embodiment of the present invention.
Figure 6B:
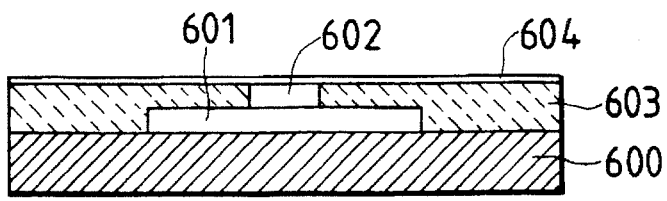
Figure 6C:
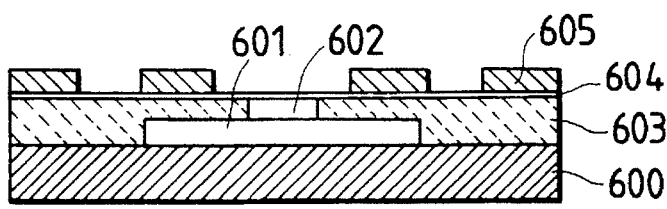
Figure 6D:
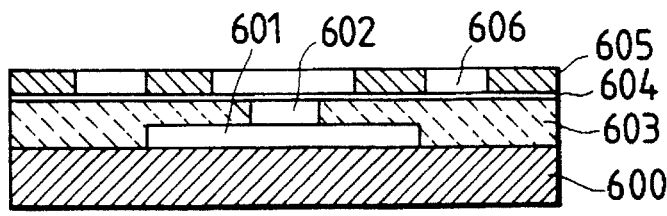
Figure 6E:
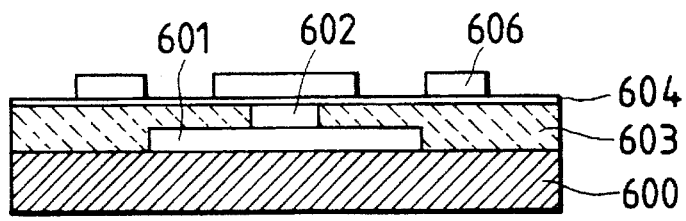
Figure 6F:
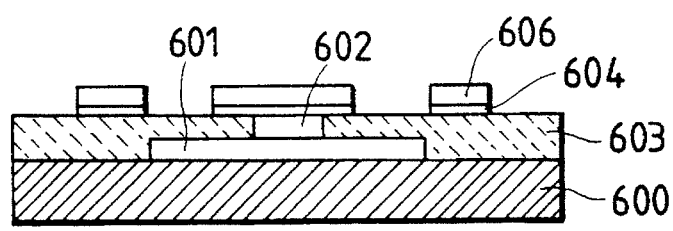

A second method includes a step of forming a conductive undercoat film 604 for electroplating or electroless plating for connection with the vertical via conductor 602 of the base substrate 600 as shown in FIGS. 6a and 6b; a step of forming a positive pattern of a resist 605 for the horizontal wiring conductor at a desired position on the conductive undercoat film 604 as shown in FIG. 6c; a step of filling the positive pattern of the resist with the horizontal wiring conductor 606 as shown in FIG. 6d; a step of removal of the resist 605 as shown in FIG. 6e; and a step of etching unnecessary portions of the conductive undercoat film 604 as shown in FIG. 6f. This second method is used to form the horizontal wiring conductors, particularly the one on the top surface. Numerals 601 and 603 in FIG. 6 indicate the horizontal wiring conductor and the insulation film, respectively.

Figure 7A:
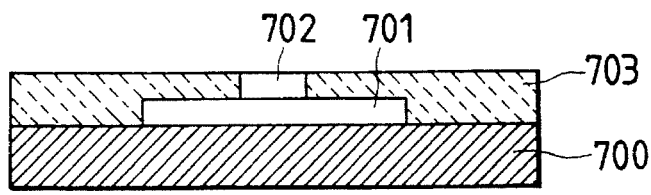
FIGS. 7a, 7b, 7c, 7d, 7e, and 7f depict cross-sectioned views illustrating process steps of forming an uppermost wiring layer in another embodiment of the present invention.
Figure 7B:
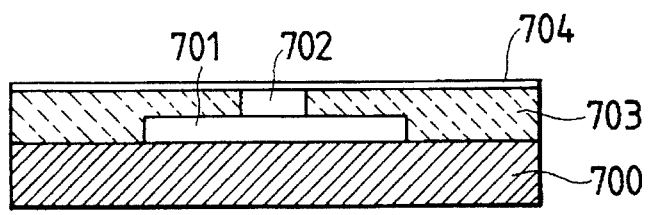
Figure 7C:
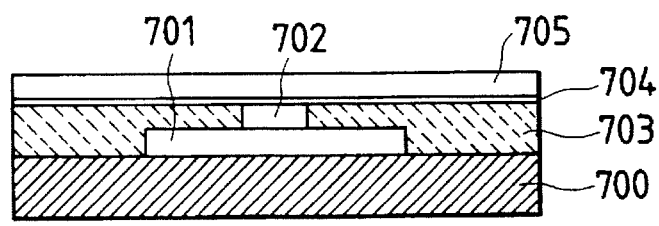
Figure 7D:
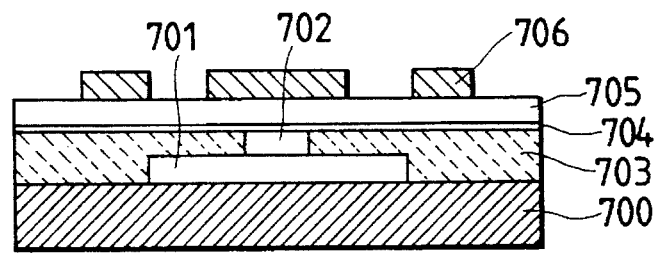
Figure 7E:
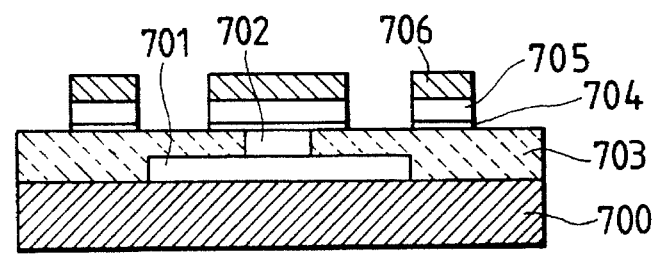
Figure 7F:
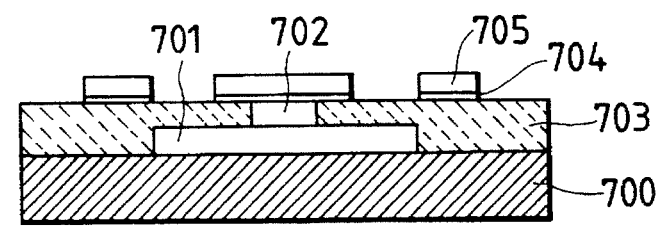

A third method includes a step of forming a conductive undercoat film 704 for electroplating or electroless plating for connection with the vertical via conductor 702 of the base substrate 700 as shown in FIGS. 7a and 7b; a step of forming a conductor 705 on the conductive undercoat film 704 as shown in FIG. 7c; a step of forming a negative pattern of a resist 706 for the horizontal wiring conductor at a desired position on the conductor 705 as shown in FIG. 7d; a step of patterning the conductor 705 and the conductive undercoat film 704 to desired shapes by etching as shown in FIG. 7e; and a step of removal of the resist 705 as shown in FIG. 7f. Alternatively, the conductive undercoat film 704 and the conductor 705 can be formed at the same time. Also, this third method is used to form the horizontal wiring conductors, particularly the one on the top surface. The third method is a subtractive process, while the second method is a additive process. Numerals 701 and 703 in FIG. 7 indicate the horizontal wiring conductor and the insulation film, respectively.

Figure 8A:
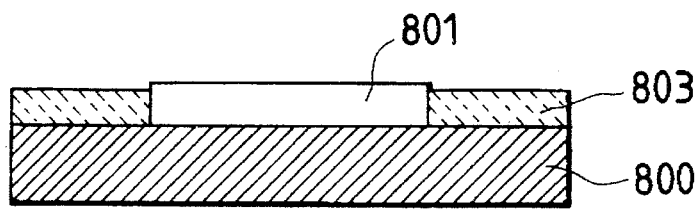
FIGS. 8a, 8b, 8c, and 8d depict cross-sectioned views illustrating an example of steps of forming a vertical via conductor on a horizontal wiring conductor in the method of fabricating a multilayer wiring board of the present invention.
Figure 8B:
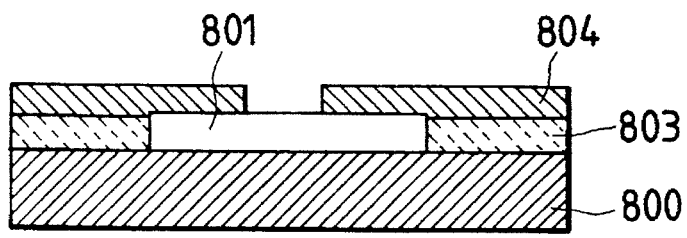
Figure 8C:
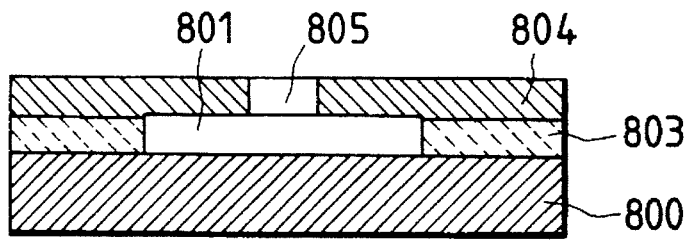
Figure 8D:
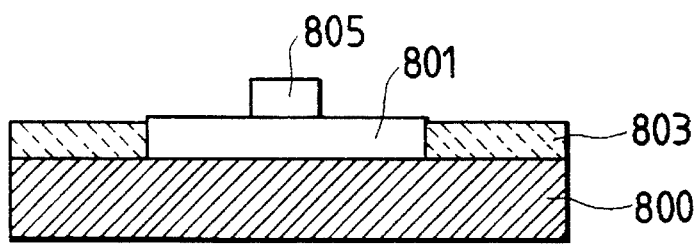

A fourth method includes a step of forming a positive pattern of a resist 804 for the vertical via conductor 804 at a desired position on the horizontal wiring conductor 801 of the base substrate 800 as shown in FIGS. 8a and b; and a step of filling the positive pattern of the resist with the vertical via conductor 805 as shown in FIG. 8c before removal of the resist 804 as shown in FIG. 8d. This fourth method is a process of forming the vertical via conductor on the horizontal wiring conductor, while the first, second, and third methods are processes of forming the conductors, including the horizontal wiring conductors on the vertical via conductors. A numeral 803 in FIG. 8 indicates the insulation film.

The methods of forming the wirings can be applied to any types of boards, including the printed wiring board, the metal cored wiring board, and the ceramic wiring board, as the base substrate. However, as the methods of forming the printed wiring board includes some special cases, they are described below. The numeral 803 designates an insulation layer.

Figure 9A:
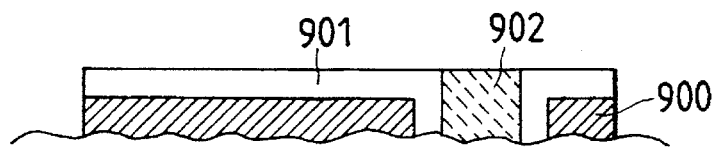
FIGS. 9a, 9b, 9c, 9d, 9e, 9f, and 9g depict cross-sectioned views illustrating another example of process steps of forming a wiring layer in the present invention.
Figure 9B:
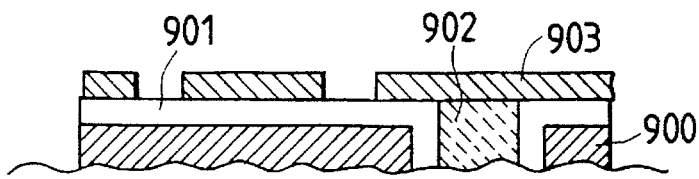
Figure 9C:
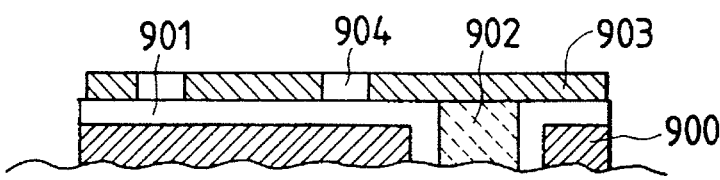
Figure 9D:
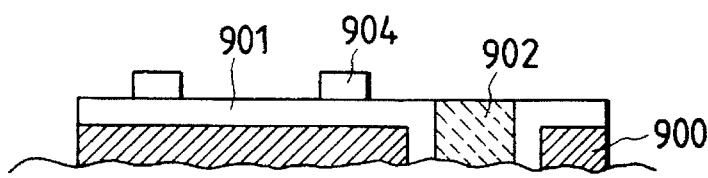
Figure 9E:
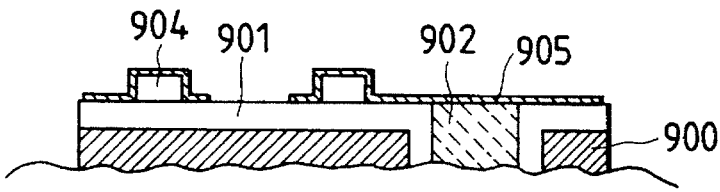
Figure 9F:
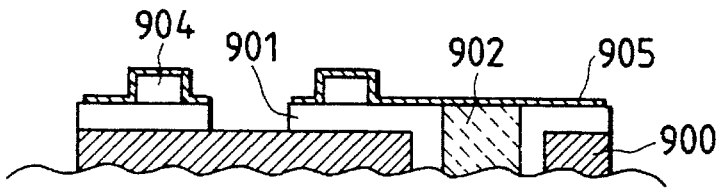
Figure 9G:
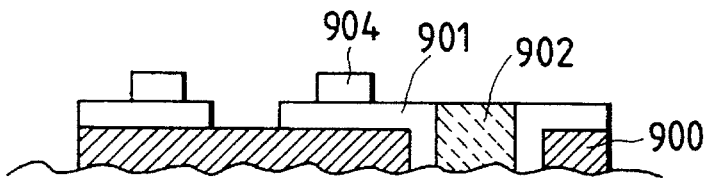

A first method includes a step of forming a positive pattern of a resist 903 for the vertical via conductor wiring at a desired position on a surface-layer conductor 901 having no patterning of the printed wiring board 900 as shown in FIGS. 9a and 9b; a step of filling the positive pattern of the resist with the vertical via conductor 904 as shown in FIG. 9c; a step of removal of the resist 903 as shown in FIG. 9d; a step of forming a negative pattern of a resist 905 at a desired position as shown in FIG. 9e; a step of patterning the surface-layer conductor 901 to a desired shape by etching as shown in FIG. 9f; and a step of removal of the resist 905 as shown in FIG. 9g. In some cases, the vertical via conductor can be replaced by the horizontal wiring conductor. A numeral 902 in FIG. 9 indicates the insulation film.

Figure 10A:
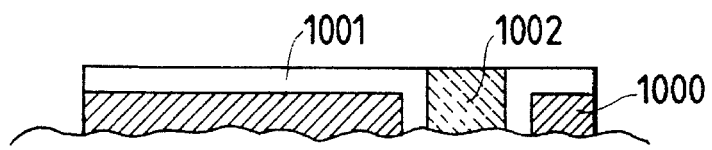
FIGS. 10a, 10b, 10c, 10d, 10e, 10f, and 10g depict cross-sectioned views illustrating still another example of process steps of forming a wiring layer in the present invention.
Figure 10B:
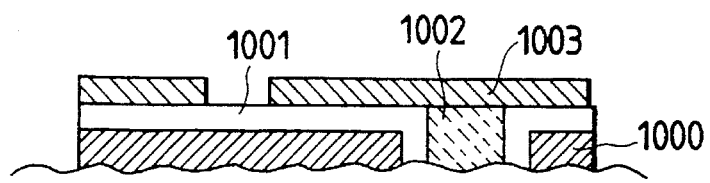
Figure 10C:
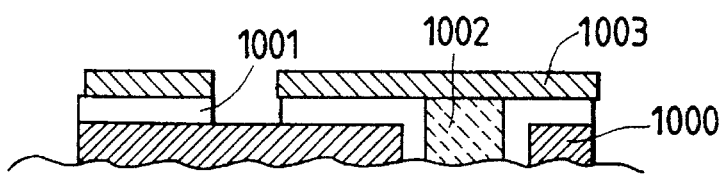
Figure 10D:
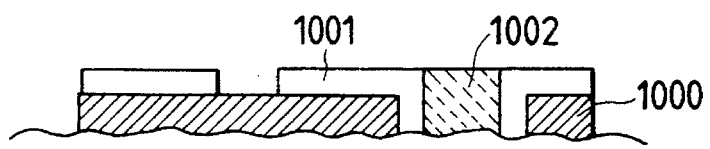
Figure 10E:
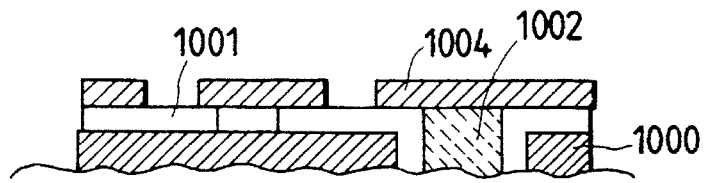
Figure 10F:
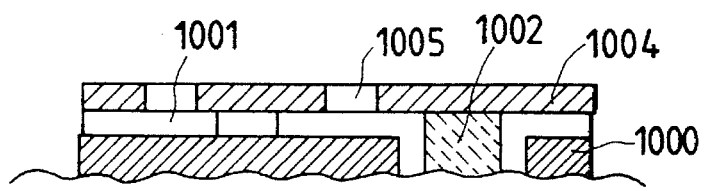
Figure 10G:
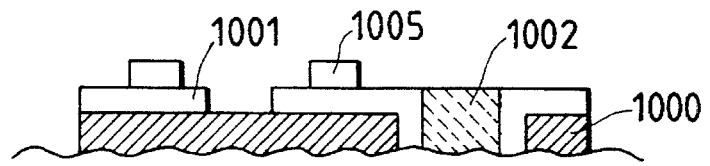

A second method includes a step of forming a negative pattern of a resist 1003 at a desired position on a surface-layer conductor 1001 having no patterning of the printed wiring board 1000 as shown in FIGS. 10a and 10b; a step of patterning the surface-layer conductor 1001 to a desired shape by etching as shown in FIG. 10c; a step of removal of the resist 1003 as shown in FIG. 10d; a step of forming a positive pattern of a resist 1004 for the vertical via conductor at a desired position as shown in FIG. 10e; a step of filling the positive pattern of the resist with the vertical via conductor 1005 as shown in FIG. 10f; and a step of removal of the resist 1004 as shown in FIG. 10g. In some cases, also, the vertical via conductor can be replaced by the horizontal wiring conductor. A numeral 1002 in FIG. 10 indicates the insulation film.

Figure 11A:
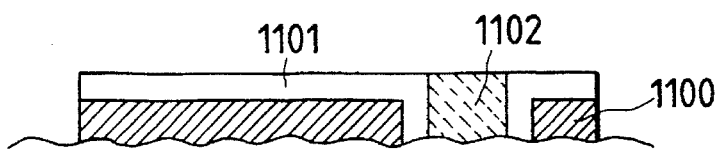
FIGS. 11a, 11b, 11c, 11d, and 11e depict cross-sectioned views illustrating still another example of process steps of forming a wiring layer in the present invention.
Figure 11B:
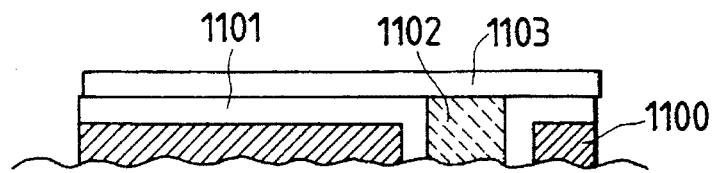
Figure 11C:
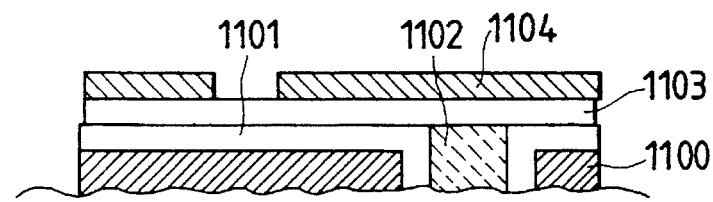
Figure 11D:
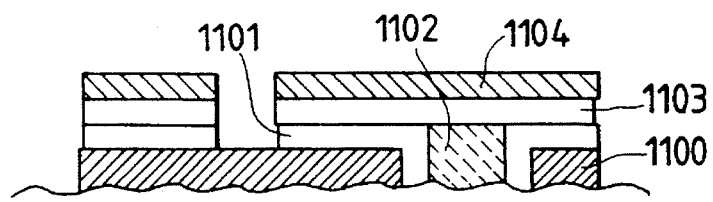
Figure 11E:
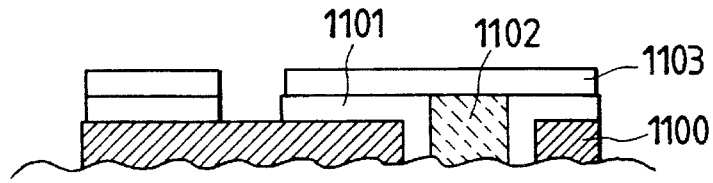

A third method includes a step of forming a conductor 1103 for the horizontal wiring or the vertical via conductor on an entire surface of a surface-layer conductor 1101 having no patterning of the printed wiring board 1100 as shown in FIGS. 11a and 11b; a step of forming a negative pattern of a resist 1104 at a desired position as shown in FIG. 11c; a step of patterning the conductors 1101 and 1103 to a desired shape by etching as shown in FIG. 11d; and a step of removal of the resist 1104 as shown in FIG. 11e. A numeral 1102 in FIG. 11 indicates the insulation film.

The following describes in detail the process of the conductive undercoat film for connection of the base substrate with the vertical via conductor.

Available methods of forming the conductive undercoat film include the known dry filming methods, such as the sputtering process, the evaporation process, the ion plating process, and the flame spraying process. They also include the wet method, such the electroless plating process. However, the following filming method shown in FIGS. 12a to 12f is preferable in view of the cost and the adhesive strength with the insulation film.

Figure 12A:
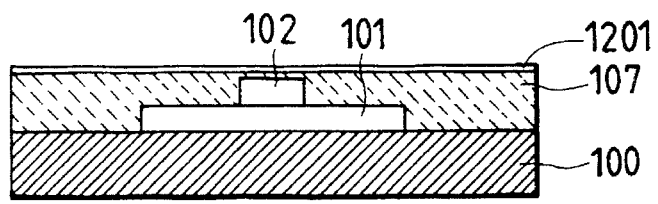
FIGS. 12a, 12b, 12c, 12d, 12e, and 12f depict cross-sectioned views illustrating process steps of forming a conductor undercoat film in an embodiment of the present invention.
Figure 12B:
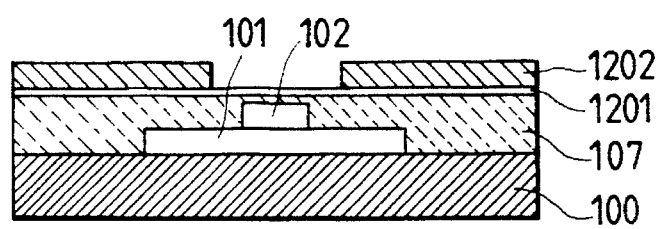
Figure 12C:
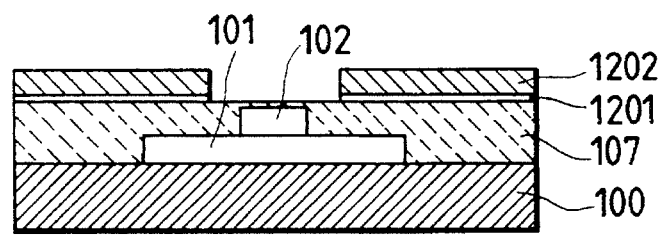
Figure 12D:
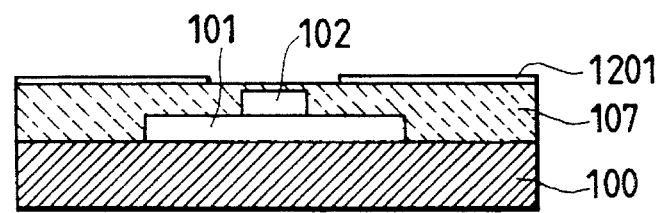
Figure 12E:
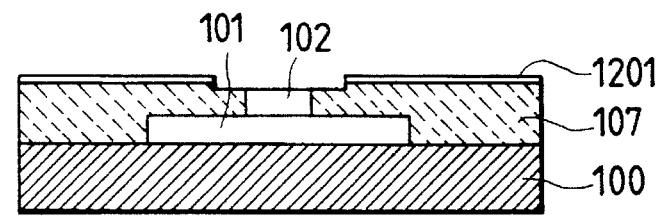
Figure 12F:
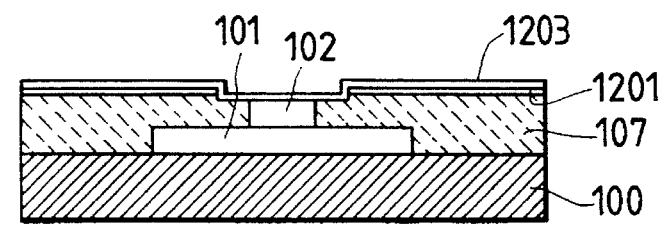

The method includes a step of forming an organic insulation film 107 of the structure shown in FIG. 12a with a conductor foil 1201 of Cu of 0.2 to 10 μm thick that put in between the mold 104 and the solvent-free fluid polymer precursor 103 at steps shown in FIGS. 1b and 1d; a step of forming a positive pattern of a resist 1202 at a desired position of the conductor foil 1201 as shown in FIG. 12b; a step of etching the conductor foil 1201 on an upper portion of the vertical via conductor 102 through the insulation film 107 with a mask of the pattern of the resist as shown in FIG. 12c; a step of removal of the resist 1202 as shown in FIG. 12d; a step of etching the insulation film 107 on the upper portion of the vertical via conductor 102 with a mask of a pattern of the conductor foil 1201 as shown in FIG. 12e; and a step of forming an electroless plating film on an entire surface of the matter as shown in FIG. 12f. The conductor foil 1201 may be made of Al or Au in place of Cu. In view of the treatment, the method may further include a step of using a conductor foil 1201 formed on a metal foil, for example, of stainless steel of around 50 μm thick, by plating 1201 aligning the conductor foil 1201 to contact the polymer precursor 103, and hardening the solvent-free fluid polymer precursor 103 before removal of the metal foil of stainless steel or the like. Also, this method can form the structure shown in FIG. 12a. The method may further made in such a way that a surface contacting the insulation film 107 for the conductor foil 1201 or the conductor foil 1201 and the wiring layer comprising at least one of the horizontal wiring conductor 101 and the vertical via conductor 102 is made rough before the insulation film is formed. This method provides an anchor effect to further increase the adhesive strength of the conductor with the insulation film.

The following describes about the solvent-free fluid polymer precursor in detail.

The solvent-free fluid polymer precursor used here is one or more fluid organic compounds or a composition containing the compounds at an initiation temperature of the hardening and/or a pressure, and should have a viscosity of not higher than 20,000 P (poise) at not higher than the initiation temperature of the hardening preferably not higher than 10,000 P, more preferably not higher than 5,000 P. Even the solvent-free fluid polymer precursor of higher viscosity than above can be used if it can be formed by heating it to a high temperature not higher than the initiation temperature of the hardening to soften.

The hardened polymers formed of such solvent-free fluid polymer precursor are needed to have a heat resistance enough to endure a heat process, such as soldering or annealing, in fabricating the multilayer wiring board or a module having this used. Also, the hardened polymers have to be cheap than the usual polyimide to contribute to making lower the fabrication cost of the multilayer wiring board. Further, the hardened polymers have to contribute to making the hardening temperature lower than the polyimide and making shorter the process period for forming the insulation film. It should be noted that the lower hardening temperature also is an important condition to make the method of the present invention applicable to the printed wiring board having a organic insulation material. The solvent-free fluid polymer precursors meeting such requirements include, for example, (i) an epoxy resin composition, (ii) a compound having two or more maleimide moiety in each of molecules thereof or a composition containing the compound, (iii) a compound having two or more cyanate moiety in each of molecules thereof or a composition containing the compound, and (iv) a compound having two or more benzocyclobutene moiety in each of molecules thereof or a composition containing the compound, and a mixture of two or more kinds of these compounds and compositions. Examples of the solvent-free fluid polymer precursors (i) to (iv) are:

(i) A composition of bis (diglycidyloxy) naphthylmethane of 100 wt parts and phenol novolak resin of 67 wt parts;

A composition of bis (4-diglycidylaminophenyl) methane of 100 wt parts and phenol novolak resin of 100 wt parts;

A composition of bis (diglycidyloxy) naphthylmethane of 100 wt parts and 5-(2, 5 dioxotetrahydro-3-furanyl) 3-methyl-3cyclohexene-1, 2-dicarboxlic anhydride of 36 wt parts;

A composition of bis (4-diglycidylaminophenyl) methane of 100 wt parts and 4, 4'-diaminodiphenylmethane of 45 wt parts; and A composition of bisphenol A diglycidyl ether of 100 wt parts and phenol novolak resin of 62 wt parts.

(ii) A compound of N, N'-(4, 4'-methylenediphenylen) dimaleimide;

A compound of N, N'-(4-methyl-1, 3-phenylene) dimaleimide;

A composition of N, N'-(4, 4'-methylenediphenylen) dimaleimide of 100 wt parts and 4, 4'-diaminodiphenylmethane of 55 wt parts;

A compound of N, N'-(p, p'-isopropylidenediphenylene) dimaleimide; and

A composition of N, N'-(p, p'-isopropylidenediphenylene) dimaleimide of 100 wt parts and 2, 2'-bis (4-cyanatophenyl) propane of 290 wt parts.

(iii) A compound of 2, 2'-bis (4-cyanatophenyl) propane;

A compound of bis (4-cyanatophenyl) methane; and

A composition of 2, 2'-bis (4-cyanatophenyl) propane of 80 wt parts, 2, 2'-bis (4-cyanatophenyl) propane cyclic trimer of 10 wt parts, and N, N'-(4, 4'-methylenediphenylen) dimaleimide of 10 wt parts;

(iv) A compound of 1, 3-di [bicyclo (4, 2, 0) octa-1, 3, 5-trienylethenyl]-1, 1', 3, 3'-tetramethyldisiloxane;

A compound of 1, 2-ethenylenebis [bicyclo (4, 2, 0) octa-1, 3, 5-triene]; and

A composition of 1, 3-di [bicyclo (4, 2, 0) octa-1, 3, 5-trienylethenyl]-1, 1', 3, 3'-tetramethyldisiloxane of 100 wt parts and N, N'-(4, 4'-methylenediphenylen) dimaleimide of 46 wt parts.

The solvent-free fluid polymer precursors listed above may contain an organic polymer powder and/or an organic polymer fiber having at least one of low dielectric constant, low thermal expansion coefficient, and high heat resistance. Examples of the organic polymer powder and the organic polymer fiber include polyimide and polyamide. The organic polymer powder or the fiber can be used in a way that the gap of the wiring conductors is filled with it in advance, and the solvent-free fluid polymer precursor is filled before being hardened in the process described above. The organic powder or the fiber should be preferably contained by 1 to 300 wt parts in the precursor, and should be preferably of polyimide.

In general, such a precursor has numbers of multifunctional groups and is structured of an aromatic ring and condensation system moiety to obtain a hardened matter of high heat resistance. The precursor therefore is solid at room temperature. For the reason, the precursor should be formed like film or sheet in un-hardening state or B-stage, preferably with the bubbles eliminated. Alternatively, the precursor should be preferably made membrane in a way that the precursor is coated on the mold or the simple flat plate.

The epoxy resin composition mentioned above should be preferably made of, for example, a multifunctional epoxy resin and a multifunctional hardener. The multifunctional epoxy resin mentioned above should be preferably made of, for example, a compound having three or more epoxy groups and an aromatic ring and or a heterocycle in a molecule thereof. Particularly, a compound having the following constitutional formula is preferable.

$$Ar + X - CHCH_2)_n \atop \backslash \,/ \atop O \qquad (1)$$

where Ar is one polyvalent molecular structure selected from among molecular structures represented in Table 1, X is one or more molecular structures selected from among molecular structures represented in Table 2, and n is an integer of 3 to 6.

TABLE 1

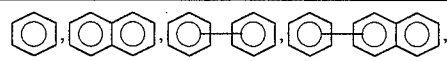

TABLE 1-continued

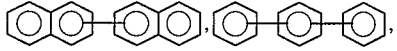

R; H or CH₃
m; An integer of 0 to 4

TABLE 2

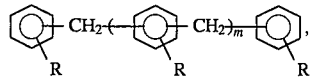

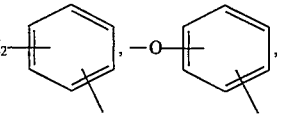

A major constituent of the multifunctional hardener should be preferably made of, for example, one or more of:

(1) a mixture of a compound selected from among a group of a compound of six or more number of carbon atoms having two or more carboxylic anhydride groups, particularly an alicyclic carboxylic anhyride, an aromatic carboxylic anhydride, or at least one of these with a compound having one or two carboxylic anhydride groups;

(2) an aromatic amino compound having two or more amino groups and two or more aromatic rings or a heterocyclic compound having an amino group; and (3) a resin having a phenolic hydroxyl group, particularly the resin contains at least one of a group of a phenol resin, a cresol resin, and a pyrogallol resin, or a heterocyclic compound having a phenolic hydroxyl group, a compound having three or more phenolic hydroxyl groups in a molecule thereof, and a compound having aliphatic hydroxyl groups, particularly a compound having three or more hydroxyl groups of a primary alcohol in a molecule thereof.

Examples of the multifunctional hardener (1) to (3) are:

(1) A compound of 3, 3', 4, 4'-benzophenonetetracarboxylic dianhydride, a compound of 5-(2, 5-dioxotetrahydro-3-furanyl)-3-methyl-3-cyclohexene-1, 2-dicarboxylic anhydride, a composition of pyromellitic dianhydride of 100 wt parts and maleic anhydride of 85 wt parts, a compound of glycerol tribenzoatehexacarboxylic trianhydride, and a composition of bicyclo [2, 2, 2]oct-7-en-2, 3, 5, 6-tetracarboxylic dianhydride of 100 wt parts and phtalic anhydride of 100 wt parts;

(2) 4, 4'-diaminodiphenyl sulfone, 4, 4'-diaminodiphenylmethane, 2, 6-diaminopyridine, and 2, 4-diamino-6-[2'-methylimidazolyl-(1')]-ethyl-1, 3, 5-triazine; and (3) Phenol novlak resin, 3-hydroxypyridine, pyrogallol, and 1, 1, 1-tris(hydroxymethyl) ethane.

Figure 13:
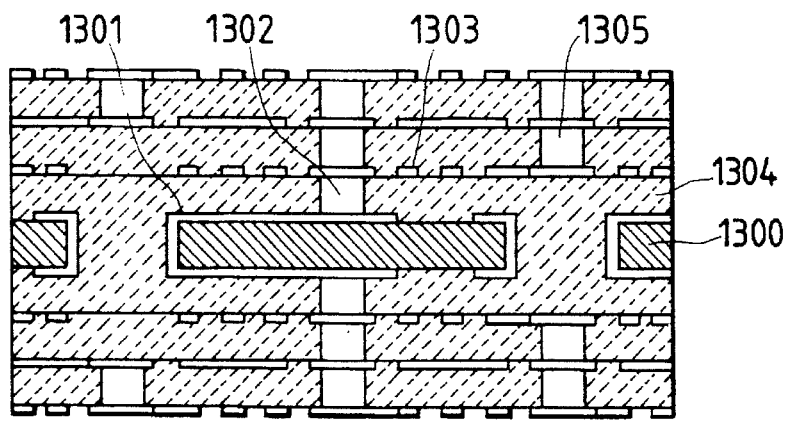
FIG. 13 depicts a cross-sectioned view illustrating a bilateral multilayer wiring board in an embodiment of the present invention.
Figure 16:
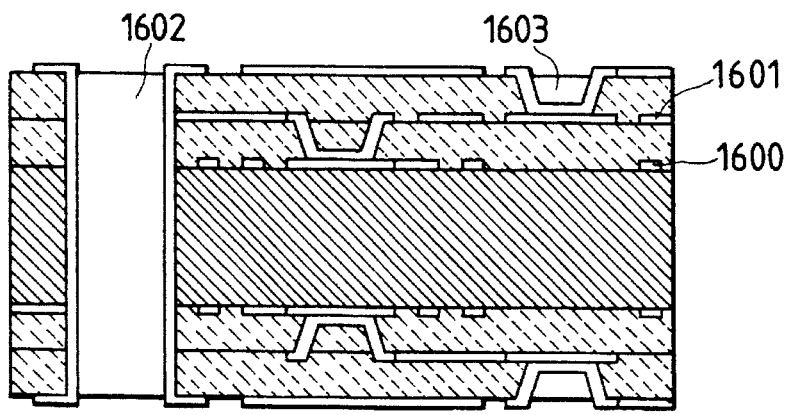
FIG. 16 depicts a cross-sectioned view illustrating an example of multilayer wiring board in prior art.
Figure 17:
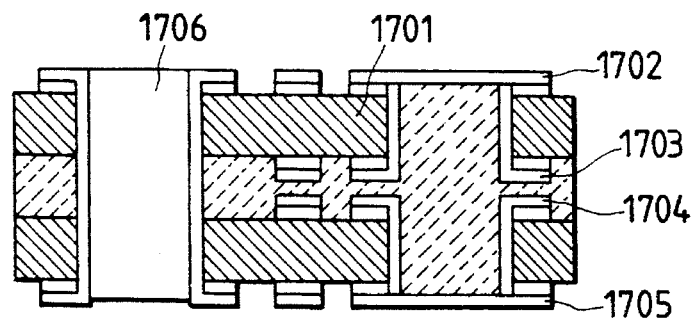
FIG. 17 depicts a cross-sectioned view illustrating another example of multilayer wiring board in prior art.
Figure 14A:
FIGS. 14a, 14b, 14c, 14d, 14e, 14f, and 14g depict cross-sectioned views illustrating an example of fabrication process steps for a multilayer wiring board in prior art.
Figure 14B:
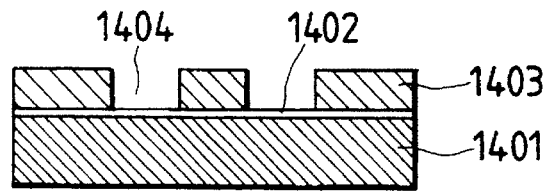
Figure 14C:
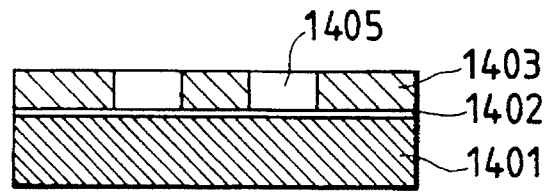
Figure 14D:
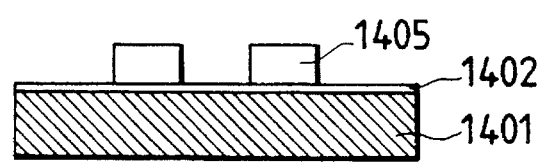
Figure 14E:
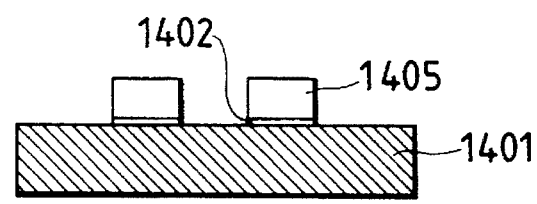
Figure 14F:
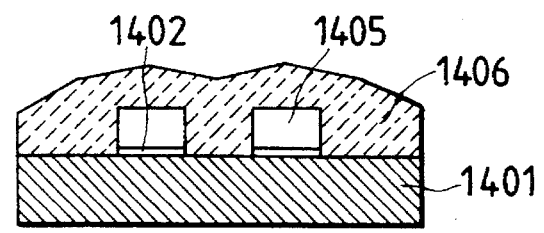
Figure 14G:
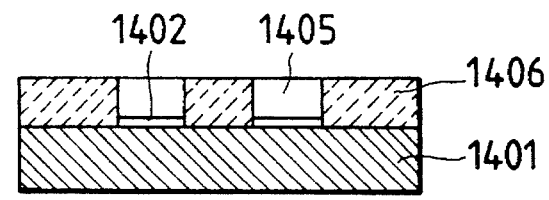
Figure 15A:
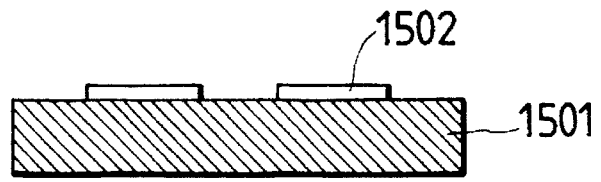
FIGS. 15a, 15b, 15c, 15d, and 15e depict cross-sectioned views illustrating another example of fabrication process steps for a multilayer wiring board in prior art.
Figure 15B:
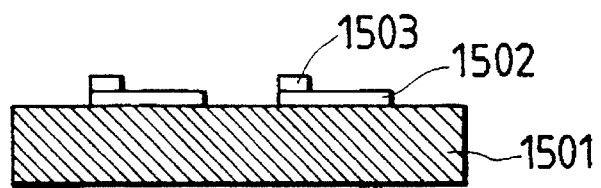
Figure 15C:
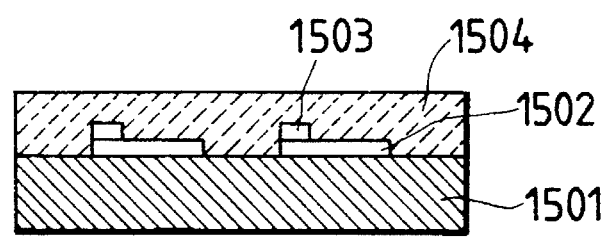
Figure 15D:
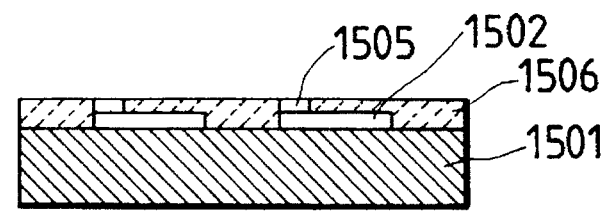
Figure 15E:
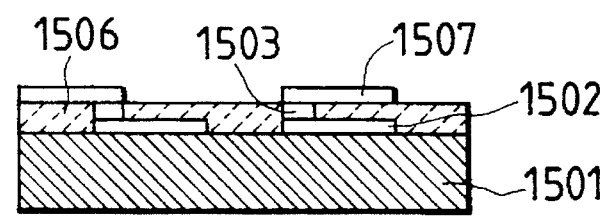

With the method of forming the multilayer wiring board described above, the thin-film multilayer wiring structure formed on the ceramic wiring board can be formed also on the printed wiring board. The structure is featured in that as shown in FIG. 13, for example, the printed wiring board 1300 having a conductor 1301 in a filled inter-layer connection through-hole and/or a patterned surface-layer conductor and a via conductor 1302 connected with the conductor has at least one of conductor pattern layers 1303 and inter-layer insulation film layers 1304 of organic polymer alternately formed on a single surface thereof or both surfaces thereof, the via conductor 1302 and the conductor pattern layers 1303 being electrically connected together, and the conductor pattern layers 1303 being electrically connected together. The via conductor 1302 formed on the printed wiring board or a via conductor 1305 electrically connecting the conductor pattern layers 1303 together can be made like a fine pillar.

The method of fabricating multilayer wiring board of the present invention provides extraordinary features listed below.

(i) The solvent-free fluid polymer precursor is used as the starting material for the inter-layer insulation layer. This can prevent generation of voids and pinholes due to evaporation of the remaining solvent in hardening.

(ii) The polymer precursor is aligned before the space between the mold and the base substrate is exhausted. This can prevent such an adverse effect that air is involved in between the wiring layer and the polymer precursor, gaps and bubbles are made to remain, and these cause voids and pinholes to generate.

(iii) The hydrostatic pressure is applied so that the pressure can be uniformly exerted on the entire polymer precursor. This makes no usual differences of the physical properties between the central portion of the insulation layer having higher pressure and the circumferential portion of the insulation layer having lower pressure. Also, hydrostatic pressure cannot make the precursor leak off the substrate. Further, the hydrostatic pressure can prevent take-in of air from generating voids and pinholes on the circumferential portion.

(iv) With the above-mentioned exhausting step and the above-mentioned hydrostatic pressure application step, the polymer precursor having wide range of viscosity can be used as the starting material for the inter-layer insulation layer.

With the above-described structure, the present invention provides further features as follows.

The present invention can form the planar insulation film with the uniform film thickness and physical properties in the entire substrate at a time without deforming and destructing the conductor and without void and pinhole. Also, the process for exposing the upper surface of the horizontal wiring conductor or the vertical via conductor with the upper surface covered with the insulation film is the process for etching back the insulation film in the wet etching or dry etching method. The upper surface of the conductor, therefore, can be exposed with the insulation film kept planar, and also the surface of the insulation film can be kept adhesive. Further, the conductor is polished to make the conductor height uniform with the surface of the conductor exposed a little. The polishing process, therefore, can be made very simply in a sort time.

The process for forming the conductive undercoat film in forming the wiring layer comprising at least one of another horizontal wiring conductor and another vertical via conductor connected with said horizontal wiring conductor and said vertical via conductor is not only made in the usual dry filming method and electroless plating step, but also in the step described below. The step of forming the conductive undercoat film connected with the vertical via conductor of the base substrate includes the step of forming the organic insulation film with the conductor foil that put in between the mold and the solvent-free fluid polymer precursor at the above-mentioned steps 2 to 6; the step of forming the positive pattern of the resist at the desired position of the conductor foil; the step of etching the conductor foil on the upper portion of the vertical via conductor with the mask of the pattern of the resist; the step of removal of the resist; the step of etching the insulation film on the upper portion of the vertical via conductor with the mask of the pattern of the conductor foil; and the step of electroless-plating on the entire surface of the matter. Further, the conductor foil and/or conductor surface contacting the insulation film is made rough. These steps can replace the usual problem of adhesive strength due to the anchor effect of the electroless plated film and the rough-surface insulation film by the problem of adhesive strength due to the anchor effect of the rough-surface conductor foil and the insulation film, being not virtually related to the structure of the insulation film. The conductive undercoat film having high adhesive strength, thus, can be simply formed at a low cost.

Further, the present invention uses a general-purpose high resolution resist instead of the photosensitive insulating material. The grooves of the resist is filled with the conductor by plating. These allow the fine via and wiring to be formed of the thick conductor.

In addition, the above-described fabrication method can be applied to the both surfaces of the base substrate to decrease the number of steps and to shorten the lead time and to reduce the warp of the base substrate as well.

The present invention uses the solvent-free fluid polymer precursor containing at least one of the multifunctional epoxy resin composition, the compound having two or more maleimide moiety in each of molecules thereof or the composition containing the compound, the compound having two or more cyanate moiety in each of molecules thereof or the composition containing the compound, the compound having two or more benzocyclobutene moiety in each of molecules thereof or the composition containing the compound, or the mixture of two or more kinds of these compounds and compositions. The above-mentioned solvent-free fluid polymer precursor is cheaper and can be hardened and formed at a lower temperature than the usual polyimide. This allows fabrication of the high-density multilayer wiring board having high heat resistance, high mechanical characteristics, and high electrical characteristics at a low cost and at a high through-put in a short lead time. The low hardening temperature for the insulation film can apply the above-described fabrication method to the printed wiring board.

The above-described method of fabricating the multilayer wiring board can form an unusually high density multilayer wiring board in the field of printed wiring board.

The multilayer wiring board having the printed wiring board used for the base substrate is structured so that the printed wiring board having the conductor in the filled inter-layer connection through-hole and/or the patterned surface-layer conductor and the via conductor connected with the conductor has at least one of conductor pattern layers and inter-layer insulation film layers of organic polymer alternately formed on the single surface thereof or both surfaces thereof, the via conductor and the conductor pattern layers being electrically connected together, and the conductor pattern layers being electrically connected together. Further, the via conductor formed on the printed wiring board or the via conductor electrically connecting the conductor pattern layers together is made like the pillar. These are effective in that as there is no effect of the plated through-hole of the base printed wiring board, the thin-film multilayer wiring layer can be formed on that. Also, as there is no plated through-hole (that is, the through-hole passing through the highest surface and the lowest surface of the multilayer wiring board) to be formed at the final stage, the degree of freedom of the wiring can be increased, and the wiring density of the thin-film multilayer wiring layer on the base substrate can be increased to a maximum limit. Further, it is possible to make the connection of the thin-film multilayer wiring layer on the base substrate with the inner conductor layer of the base substrate, the connection of the both surfaces of the base substrate, and the connection of the conductor layers without the plated through-hole at the final stage. Still further, as the shape of the via conductor is like the pillar, the surface area occupied by the via conductor including the land is made narrower than the conformal via so that the high density multilayer wiring can be made. At the same time, as the upper surface of the via conductor is planar, the next pillar-like via conductor can be formed on that. This means that the number of vias cannot be lost as no vias at two positions are used for connection of separated thin-film multilayer wiring layers. Also, the thermal via can be formed.

DETAILED DESCRIPTION OF THE PREFERRED EMBODIMENTS

Some embodiments of the present invention are illustrated and described below in detail by reference to the accompanying drawings, but it is particularly understood that the present invention is not limited thereto or thereby.

EMBODIMENT 1

Embodiment 1 is described below by reference to FIGS. 1a to 1h, FIGS. 2a to 2i, FIGS. 4a to 4c, FIGS. 5a to 5h, and FIGS. 6a to 6f.

As a base substrate 100 was prepared a copper/glass-ceramic substrate which was a wiring glass-ceramic plate having copper wires structured as shown in FIG. 2f. The base substrate was structured as shown in FIG. 1a.

Then, kneading was made of 100 wt % of an epiclon EXA4700 manufactured by Dainippon Ink & Chemicals, Inc. as naphthalene tetrafunctional epoxy resin with 65 wt % of a berkam TD-2131 manufactured by Dainippon Ink & Chemicals, Inc. as phenolic resin. The kneading was put in between two fluoropolymer sheets before being melted at 70° C. under hydrostatic pressure similar to that of a molding method, which will be described later, to form a film 103 of epoxy resin composition. As shown in FIG. 1b, one fluoropolymer sheet was peeled off. The film of the epoxy resin composition was put on the conductor layer side of the substrate. (The remaining fluoropolymer sheet was not shown in the figure.) As shown in FIG. 1c, the substrate and the film of epoxy resin composition were put in a mold 104 which was coated with a fluoropolymer and has a surface roughness less than 1 μm. The resin was supplied as shown in FIG. 4a.

After that, as shown in FIG. 1d, the mold was heated up to 70° C. to melt the composition. A space 105 between the mold and the substrate was exhausted at 10 torr from an exhausting port 106 before the space was kept for above seven minutes. The composition 103 was filled in among the wirings. The pressure of the space 105 between the mold and the substrate, then, was returned to the atmospheric pressure. A vertical compression pressure of 5 kgf/cm$^2$ was exerted to them, and a horizontal air pressure of 5 kgf/cm$^2$ were applied from the exhausting port 106. In five minutes, the temperature of the mold was risen from 70° C. to 200° C. at a rate of 70° C. per minute before the mold was kept for 30 minutes. The mold was detached. The fluoropolymer sheet was peeled off. Heating of the substrate was made at 220° C. for 60 minutes at normal pressure. The composition was formed to a planar insulation layer 107 of uniform physical properties without void and pinhole as shown in FIG. 1e.

The vertical via conductor 102 made on the substrate in such a way included portions in which upper surfaces of the conductor were not exposed. The substrate, as shown in FIG. 1f, was exposed to an O$_2$ plasma to etch back the insulation film 107 to around 1 μm until the upper surface of vertical via conductor 102 was completely exposed out. In the process, conditions on a O$_2$ plasma ashing apparatus were as follows.

O$_2$ plasma flow rate: 5 SCCM (Standard (0° C. and 1 atm) Cubic Centimeter per Minute).

O$_2$ plasma: 2.7 Pa.

Incoming power: 100 W.

Process time: 15 min.

In order to further increase the planarity, as shown in FIG. 1g, the upper surface of the vertical via conductor 102 was polished by an abrasive tape until completely planar surface was formed.

The next process steps in FIGS. 1g and 1h are described by reference to FIG. 5. The substrate in FIG. 1g, or FIG. 5a, as shown in FIG. 5b, had a conductive undercoat film 504 of Cr/Cu/Cr having a thickness of 0.5 to 0.8 μm formed thereon. As shown in FIG. 5c, a photoresist (cresol-novolak positive type) 505 was coated on the conductive undercoat film, and grooves having a pattern corresponding to the horizontal wiring conductive pattern were formed by exposure and development. A potassium ferricyanide etchant was used to etching-remove Cr from the grooves to expose Cu out. In turn, as shown in FIG. 5d, a horizontal wiring conductor 506 was formed by copper electroplating with a cupric sulfate plating in the grooves of the resist. A composition of the cupric sulfate plating solution was as follows.

Copper sulfate pentahydrate: 75g/l

Sulfuric acid: 98 ml/l
Hydrochloric acid: 0.15 ml/l
Addition agent: 10 ml/l

Further, as shown in FIG. 5e, a groove for a vertical via conductor was formed on a similar resist 507 by filming, exposure, and development. The vertical via conductor 508, as shown in FIG. 5f, was formed in the groove by cupric sulfate plating. After this, as shown in FIG. 5g, the two resist layers were dissolved to remove by an alkaline aqueous solution. Further, as shown in FIG. 5h, the metallic undercoat film was etched to remove by a cerium (IV) diammonium nitrate etchant to form a conductor layer comprising the horizontal wiring conductor and the vertical via conductor. The structure in FIG. 5h corresponds to the one in FIG. 1h. Further, the process steps from FIGS. 1b to 1h were repeated two times. Then, the process steps from FIGS. 1b to 1g were made. Finally, an uppermost layer was formed at process steps shown in FIGS. 6a to 6f. (The materials and processes used were not substantially different from those in FIGS. 5a to 5h. A difference was that the two layers of horizontal wiring conductor and vertical via conductor was used, but only one layer of horizontal wiring conductor was formed.) Thus, a multilayer wiring board of four thin-film wiring layers in total was formed. The horizontal wiring conductor formed was 25 μm wide, 18 μm high, and 50 μm minimum interval. The vertical via conductor formed was 25×25 μm wide and 18 μm high.

EMBODIMENT 2

As a base substrate was prepared a tungsten/mullite-ceramic substrate of structure shown in FIG. 2f. The base substrate was structured as shown in FIG. 1a. A multilayer wiring board was prepared in the same other conditions as the ones in embodiment 1.

EMBODIMENT 3

As a base substrate was prepared a metal cored glass-polyimide printed wiring board having copper as core material in a structure shown in FIG. 2d. The base substrate was structured as shown in FIG. 1a. A multilayer wiring board was prepared in the same other conditions as the ones in embodiment 1.

EMBODIMENT 4

The shape of the epoxy resin composition was changed from the film state in FIG. 4a to a powder state in FIG. 4b. The epoxy resin composition in embodiment 1 was kneaded and ground to powder. The powder was sprinkled in among wirings of the conduction layer on the base substrate. A multilayer wiring board was prepared in the same other conditions as the ones in embodiment 1. A particle size of the powder was made 10 to 100 μm.

EMBODIMENT 5

The shape of the epoxy resin composition was changed from the film state in FIG. 4a to a membrane state applied to the mold in FIG. 4a. The epoxy resin composition in embodiment 1 was melted and stuck to the surface of the mold. A multilayer wiring board was prepared in the same other conditions as the ones in embodiment 1.

EMBODIMENT 6

The shape of the epoxy resin composition was changed from the film state in FIG. 4a to a membrane state applied to the mold in FIG. 4a. The epoxy resin composition in embodiment 1 was dissolved in methyl ethyl ketone. The solution was roll-coated to the surface of the mold. The solvent was heated to dry to the membrane state. A multilayer wiring board was prepared in the same other conditions as the ones in embodiment 1.

EMBODIMENT 7

The shape of the epoxy resin composition was changed from the film state in FIG. 4a to a membrane state applied to the conductor layer in FIG. 4c. The epoxy resin composition in embodiment 1 was dissolved in methyl ethyl ketone. The solution was roll-coated to the base substrate having the conductor layer. The solvent was heated to dry to the membrane state. A multilayer wiring board was prepared in the same other conditions as the ones in embodiment 1.

EMBODIMENTS 8 TO 22

As to the epoxy resin composition of the multilayer wiring boards formed in ways similar to the one in embodiment 1, Table 3 shows compositions, hardening condition, and physical properties of the other epoxy resins prepared in embodiments 8 to 22. In Table 3, α, Tg, and Td denote a thermal expansion coefficient, a glass transition temperature, and an initiation temperature of thermal decomposition, respectively.

EMBODIMENT 23

The epoxy resin composition in embodiment 1 was replaced by a liquid membrane which was prepared in a way that a benzocyclobutene dielectric, the dielectric was the oligomerized 1, 2-ethenylenebis [bicyclo (4, 2, 0) octa-1, 3, 5-triene] obtained by the treatment of the monomer at 180° C. for five hours, was roll-coated on the mold at room temperature to liquid membrane. With

TABLE 3

| Embodiment | Epoxy resin | Hardener wt % to Epoxy resin | Addition agent wt % to Epoxy resin | Hardening temperature °C. | α (E-05/K) | Tg (°C.) | Td (°C.) |
| --- | --- | --- | --- | --- | --- | --- | --- |
| 8, 43 | 1) EXA4700 | Cyclobutanetetracarboxylic acid dianhydride (CBTCA) (60) | 4-dimethylaminopyridine (2) | 200 | 4 | 200 | 340 |
| 9, 44 | 1) EXA4700 | B4400[1)] (82) | 4-dimethylaminopyridine (2) | 200 | 56 | 300 | 370 |
| 10, 45 | 1) EXA4700 | Pyromellitic dianhydride (34) | 4-dimethylaminopyridine (2) | 200 | 5 | 260 | 300 |

TABLE 3-continued

| Embodiment | Epoxy resin | Hardener wt % to Epoxy resin | Addition agent wt % to Epoxy resin | Hardening temperature °C. | α (E-05/K) | Tg (°C.) | Td (°C.) |
|---|---|---|---|---|---|---|---|
| 11, 46 | 1) EXA4700 | Bicyclo[2,2,2]oct-7-ene-2,3,5,6-tetracartoxylic dianhydride (59) (BOTCA) | Maleic anhydride (7) | 200 | 6 | 200 | 300 |
| 12, 47 | 1) EXA4700 | CBTA (16) + B4400 (37) + BCTCA (13) | Maleic anhydride (2) | 240 | 5 | 310 | 330 |
| 13, 48 | 1) EXA4700 | 4,4'-diaminodiphenylmethane (64) | — | 140 | 5 | 290 | 300 |
| 14, 49 | 1) EXA4700 | 4,4'-diaminodiphenyl sulfone (39) | — | 250 | 6 | 300 | 340 |
| 15, 50 | 1) EXA4700 | 2-amino-4,6-dimethylpyridine (75) | — | 230 | 5 | 300 | 350 |
| 16, 51 | 1) EXA4700 | Phenolic resin HP800N[3] (67) | N,N-dimethylaniline (3) | 180 | 6 | 250 | 330 |
| 17, 52 | 1) EXA4700 | Pyrogallol resin XPS4005B[4] (19) | 2-ethyl-4-methyl-imidazole (3) | 230 | 7 | 250 | 330 |
| 18, 53 | 1) EXA4700 | 3-hydroxypyridine (59) | — | 200 | 6 | 250 | 350 |
| 19, 54 | 1) EXA4700 | Phloroglucide (20) | Triphenyl phosphine (3) | 200 | 5 | 270 | 320 |
| 20, 55 | 1) EXA4700 | Pentaerythritol (21) | — | 270 | 5 | 220 | 350 |
| 21, 56 | 1) EXA4700 | Pentaerythritol (15) | HP800N (10) | 200 | 4 | 250 | 350 |
| 22, 57 | YH434[2] | B-4400[1] (107) | 4-dimethylaminopyridine (2) | 190 | 3 | 250 | 300 |

[1]: Manufactured by Dainippon Ink & Chemicals, Inc.
[2]: Manufactured by Tohto Kasei Co., Ltd.
[3]: Manufactured by Hitachi Chemical Co., Ltd.
[4]: Manufactured by Gen-ei Chemical Industry Co., Ltd.

With use of the liquid membrane, a multilayer wiring board was prepared in the same other conditions as the ones in embodiment 1. Note that as the benzocyclobutene dielectric was a viscous liquid, it was filled in among the wiring conductors at room temperature without heating, and hardening was made at 250° C. for one hour.

EMBODIMENT 24

The epoxy resin composition in embodiment 1 was replaced by a film which was prepared in a process that a bismaleimide/cyanate-compound BT-3309T manufactured by Mitsubishi Gas Chemical Co., Ltd. was melted at 50° C. under hydrostatic pressure to film. With use of the film, a multilayer wiring board was prepared in the same other conditions as the ones in embodiment 1. Note that the film was melted at 50° C. before being filled in among the wiring conductors, and hardening was made at 150° C. for one hour.

EMBODIMENT 25

The epoxy resin composition in embodiment 1 was replaced by a filmed composition which was prepared in a process that the epoxy resin composition was kneaded with polyimide powder of 7 to 12 μm diameter of 200 wt % before being melted at 90° C. under hydrostatic pressure. With use of the filmed composition, a multilayer wiring board was prepared in the same other conditions as the ones in embodiment 1. Note that the filmed composition was melted at 70° C. before being filled in among the wiring conductors, and hardening was made at 180° C. for ten minutes under hydrostatic pressure and at 200° C. for one hour at normal pressure.

EMBODIMENT 26

The degree of the reduced pressure in embodiment 1 was made to 20 torr. After this, a multilayer wiring board was prepared in the same other conditions as the ones in embodiment 1.

EMBODIMENT 27

The degree of the reduced pressure in embodiment 1 was kept at 10 torr. With vertical compression pressure of 10 kgf/cm$^2$ exerted, the epoxy resin composition was filled in among the wiring conductors. After this, a multilayer wiring board was prepared in the same other conditions as the ones in embodiment 1.

EMBODIMENT 28

The degree of the reduced pressure in embodiment 1 was kept at 10 torr. With vertical compression pressure of 20 kgf/cm$^2$ exerted, the epoxy resin composition was filled in among the wiring conductors. After this, a multilayer wiring board was prepared in the same other conditions as the ones in embodiment 1.

EMBODIMENT 29

The vertical compression pressure in embodiment 1 was set to 5.5 kgf/cm$^2$, and the horizontal air pressure was set to 5 kgf/cm$^2$ until the epoxy resin composition was hardened. After this, a multilayer wiring board was prepared in the same other conditions as the ones in embodiment 1.

EMBODIMENT 30

The vertical compression pressure in embodiment 1 was set to 10 kgf/cm$^2$, and the horizontal air pressure was set to 8 kgf/cm$^2$ until the epoxy resin composition was hardened. After this, a multilayer wiring board was prepared in the same other conditions as the ones in embodiment 1.

EMBODIMENT 31

The vertical compression pressure in embodiment 1 was set to 25 kgf/cm², and the horizontal air pressure was set to 20 kgf/cm² until the epoxy resin composition was hardened. After this, a multilayer wiring board was prepared in the same other conditions as the ones in embodiment 1.

EMBODIMENT 32

The method of exposing the upper surface of the vertical via conductor covered with the insulation film was changed from the $O_2$ plasma ashing to a UV/ozone etching. After this, a multilayer wiring board was prepared in the same other conditions as the ones in embodiment 1. In the process, conditions on the UV/ozone etching were as follows.

UV lamp temperature: 55° C.

Distance from UV lamp to substrate: 15 cm

Primary current and voltage of ozonizer: 5 A and 74 V

Oxygen gas pressure: 0.048 MPa $O_3$ gas flow rate: 8 l/min.

Substrate temperature: 100° C.

Process time: 20 min.

EMBODIMENT 33

The method of exposing the upper surface of the vertical via conductor covered with the insulation film was changed from the $O_2$ plasma ashing to a method of process that an etching solution composed of potassium permanganate of 0.2 mol/l and sodium hydroxide of 0.2 mol/l was used at 70° C. for ten minutes. After this, a multilayer wiring board was prepared in the same other conditions as the ones in embodiment 1.

EMBODIMENT 34

The method that the temperature of the mold was risen from 70° C. to 150° C. at a rate of 70° C. per minute under hydrostatic pressure before the mold was kept for 30 minutes, the mold was detached, and the fluoropolymer sheet was peeled off before the upper surface of the vertical via conductor covered with the insulation film was exposed, was changed from the $O_2$ plasma ashing to a method of process that an etching solution composed of potassium permanganate of 0.2 mol/l and sodium hydroxide of 0.2 mol/l was used at 70° C. for ten minutes. Further, heating was made at 220° C. at normal pressure for 60 minutes. After this, a multilayer wiring board was prepared in the same other conditions as the ones in embodiment 1.

EMBODIMENT 35

The method of exposing the upper surface of the vertical via conductor covered with the insulation film was changed from the $O_2$ plasma ashing to a method of process that an etching solution composed of chromic acid anhydride of 0.2 mol/l to saturated concentration and sulphuric acid of 0.2 mol/l was used at 70° C. for ten minutes, and neutralization was made with an alkali. After this, a multilayer wiring board was prepared in the same other conditions as the ones in embodiment 1.

EMBODIMENT 36

The forming method of the wiring of the uppermost layer in embodiment 1 was changed to the one described below. After this, a multilayer wiring board was prepared in the same other conditions as the ones in embodiment 1. The method was described by reference to FIGS. 7a to 7f. As shown in FIGS. 7a and 7b, a metallic undercoat film 704 of Cr/Cu having a thickness of 0.5 to 0.8 μm was formed. As shown in FIG. 7c, a conductor 705 was formed by copper electroplating on the metallic undercoat film. Further, as shown in FIG. 7d, a photoresist 706 having grooves of a pattern corresponding to the horizontal wiring conductive pattern was formed by exposure and development. In turn, a cerium (IV) diammonium nitrate etchant was used to etching-remove Cu and Cr from the grooves. Finally, as shown in FIG. 7f, the resist was removed to form the horizontal wiring conductor on the uppermost layer.

EMBODIMENT 37

Embodiment 37 is described below by reference to FIGS. 1a to 1b, FIGS. 2a to 2i, FIGS. 5a to 5h, and FIGS. 12a to 12f.

As a base substrate was prepared a copper/glass-ceramic substrate structured as shown in FIG. 2f. The base substrate was structured as shown in FIG. 1a. In turn, a copper foil of 3 μm thick was formed on a stainless steel plate of 500 μm thick by electroplating. A surface of the conductor of the conductor layer on the substrate in FIG. 1a and a copper foil surface on the stainless steel plate were black-oxide-treated at 95° C. for two minutes with a solution composed of sodium chlorite of 31 g/l, sodium hydroxide of 15 g/l, and sodium phosphate of 12 g/l. In turn, the epoxy resin composition used in embodiment 1 was put in between the copper foil and the fluoropolymer sheet. The epoxy resin composition was melted at 70° C. under hydrostatic pressure as in embodiment 1. The fluoropolymer sheet was peeled off. As in FIG. 1b, the laminated matter of the stainless steel plate, the copper foil, and the epoxy resin composition were attached to the conductor surface on the substrate in FIG. 1a. As shown in FIG. 1c, then, the laminated matter was put in the mold 104 which was coated with a fluoropolymer and has a surface roughness less than 1 μm.

Then, the process was passed from a similar step in FIGS. 1c–1d in embodiment 1 to harden the epoxy resin composition. The stainless steel plate was removed. The resulting structure is shown in FIG. 12a. The copper foil 1201 was free of wrinkles and cracks. The insulation layer 107 was the film of uniform physical properties without void and pinhole.

A photoresist (cresol-novolak positive type) 1202 of 25 μm thick was aligned on the copper foil 1201 for the substrate in FIG. 12a before having grooves formed on a top of the vertical via conductor 102 shown in FIG. 12b. A cupric chloride etchant, as shown in FIG. 12c, was used to etching-remove the copper foil at bottoms of the grooves. The portions having the copper foil removed include portions in which the upper surfaces of the vertical via conductor were and were not exposed. The resist was removed as shown in FIG. 12d. The insulation film, as shown in FIG. 12e, was etched back by around 1 μm with an $O_2$ plasma similar to the one in embodiment 1 until the upper surface of every vertical via conductor 102 was completely exposed out. The entire upper surface, including the upper surface of the vertical via conductors and the upper surfaces of the insulation layer around the vertical via conductors, as shown in FIG. 12f, had an electroless copper deposition film 1203 of 0.5 μm thick formed by using a catalyst and accelerator ($Sn^{4+}$-Pd system) available on the market and a cupric sulfate electroless deposition (copper sulfate-sodium hydroxide-formalin-EDTA). The metallic undercoat film comprising the copper foil 1201 and the electroless copper deposition film for the substrate in FIG. 12f corresponds to the conductive undercoat film 504 in FIG. 5b. After this, the structure comprising the horizontal conductor layer and the vertical via conductor shown in FIG. 5h, that is, the conductor layer of the structure in FIG. 1h, was formed as in embodiment 1. Note that etching the conductive undercoat film was made with use of the cupric chloride etchant.

Further, the process steps from FIGS. 1b to 1h were repeated two times as in embodiment 1. Then, the process steps from FIGS. 1b to 1g were made. Finally, an uppermost layer was formed at process steps shown in FIGS. 6b to 6f. (The conductive undercoat film was formed in the same way as above. The materials and processes used were not substantially different from those in FIGS. 5a to 5h. A difference was that the two layers of horizontal wiring conductor and vertical via conductor was used, but only one layer of horizontal wiring conductor was formed.) Thus, a multilayer wiring board of four thin-film wiring layers in total was formed. The horizontal wiring conductor formed was 25 μm wide, 18 μm high, and 50 μm minimum interval. The vertical via conductor formed was 25×25 μm wide and 18 μm high.

EMBODIMENT 38

As a base substrate was prepared a copper/glass-ceramic substrate of the structure in FIG. 2g. On the top of it was formed an insulation film in gaps among horizontal wiring conductors as in embodiment 1. In turn, a positive pattern of a resist for vertical via conductor was formed at a desired position of the horizontal wiring conductors. The vertical via conductor was filled in grooves of the resist by electroless plating before removal of the photoresist. This new base substrate was used to form a multilayer wiring board of four thin-film wiring layers in total as in embodiment 1.

EMBODIMENT 39

As a base substrate was prepared a metal cored glass-polyimide printed wiring board having copper as core material in a structure shown in FIG. 2d. The base substrate was used to form a multilayer wiring board in a process similar to the one in embodiment 1.

EMBODIMENT 40

The following describes an embodiment having a printed circuit board used as base substrate by reference to FIG. 13. The printed circuit board was a bilateral multilayer wiring board having both surface layer conductors used as two kinds of power supply layer. The both surfaces have two XY signal layers and one cap layer serving also as a grounding layer, respectively. Alternatively, the bilateral printed circuit board can have two XY signal layers formed thereinside to form a four-layer board. It is particularly understood that the present invention is not limited to the layer structure and the numbers of layers. The bilateral printed circuit board may have a thin-film multilayer wiring layer formed on either of the surfaces.

First, the following describes a method of fabricating a bilateral copper-clad glass-polyimide printed wiring board of the structure in FIG. 2a having via conductors connected with conductors of inter-layer connection through-hole and/or patterned surface-layer conductors by reference to FIGS. 3a to 3g.

The bilateral copper-clad glass-polyimide printed wiring board 300 had the plated through-hole 301 as shown in FIG. 3a and had no patterning of the surface-layer conductor. The board, as shown in FIG. 3b, had a dry film resist 303 of 20 μm thick laminated on the surface thereof to form a positive pattern at a desired position. The positive pattern of the resist, as shown in FIG. 3c, had the via conductor 304 filled therein by copper electroplating as in embodiment 1. The resist 303 was removed as shown in FIG. 3d. In turn, as shown in FIG. 3e, an electrodepositing resist 305 was formed to have a negative pattern formed at a desired position. The surface-layer conductor 302, as shown in FIG. 3f, was patterned to a desired shape by the cupric chloride etchant. The resist 305 was removed as shown in FIG. 3g. The structure in FIG. 3g corresponds to the one in FIG. 2a. The structure was regarded as the one in FIG. 1a. A multilayer wiring board was prepared in the same steps as shown in FIGS. 1a–1h. That is, the board had a film-like composition of a naphthalene tetrafunctional epoxy resin epiclon EXA4700 of 100 wt % manufactured by Dainippon Ink & Chemicals, Inc. and a phenolic resin berkam TD-2131 of 65 wt % manufactured by Dainippon Ink & Chemicals, Inc. put on the both surfaces thereof. The board then was put in a teflon-coated mold. In turn, the mold was heated up to 70° C. to melt the composition. A space between the mold and the substrate was exhausted at 10 torr before the space was kept for about seven minutes. The composition was filled in the gaps among the conductors and in the plated through-hole. The pressure of the space between the mold and the substrate, then, was returned to the atmospheric pressure. A vertical compression pressure of 5 kgf/cm$^2$ was exerted to them, and a horizontal air pressure of 5 kgf/cm$^2$ were applied to them. In five minutes, the temperature of the mold was risen from 70° C. to 200° C. at a rate of 70° C. per minute before the mold was kept for 30 minutes. The mold was detached. Heating of the substrate was made at 220° C. for 60 minutes at normal pressure. The composition was formed to a planar insulation layer of uniform physical properties without void and pinhole. The via conductor made on the substrate in such a way included portions in which upper surfaces of the conductor were and were not exposed. The substrate was immersed in an etching solution composed of potassium permanganate to etch back the insulation film as in embodiment 33 until the upper surface of the via conductor was completely exposed out. In order to further increase the planarity, the upper surface of the via conductor was polished by an abrasive buff until completely planar substrate was formed.

Thereafter, a thin-film multilayer wiring layer was formed on the substrate. A metallic undercoat film having a thickness of 0.5 to 0.8 μm was formed on the substrate by electroless copper plating. A dry film resist was formed to form a desired positive pattern for the horizontal wiring conductor. Grooves of the resist had the horizontal wiring conductor as high as the thickness of the resist formed therein by copper electroplating. Further, on the horizontal wiring conductor was formed a dry film resist to have a desired positive pattern for vertical via conductors formed. Grooves of the resist had the vertical via conductor as high as the thickness of the resist formed therein by copper electroplating. The two resist layers used to form the horizontal wiring conductor and the vertical via conductor were removed. The conductive undercoat film was etching-removed by the cupric chloride etchant. Thus, the substrate having the horizontal wiring conductor and the vertical via conductor formed was obtained.

Then, the process from the insulation film forming step to the wiring layer forming step were repeated once. Finally, the horizontal wiring conductor on the uppermost layer was formed at a process similar to the one described above. (The materials and processes used were not substantially different. A difference was that the two layers of horizontal wiring conductor and vertical via conductor was used, but only one layer of horizontal wiring conductor was formed.) Thus, a multilayer wiring board was formed as shown in FIG. 13. The horizontal wiring conductor formed was 50 μm wide, 18 μm high, and 100 μm minimum interval. The vertical via conductor formed was 50×50 μm wide and 18 μm high.

EMBODIMENT 41

A multilayer wiring board was prepared in the same other conditions as the ones in embodiment 40 by changing the method of fabricating the bilateral copper-clad glass-polyimide printed wiring board of the structure shown in FIG. 2a having the via conductor connected with the conductor of the inter-layer connection through-hole and/or the patterned surface-layer conductor as follows. That is, bilateral copper-clad glass-polyimide printed wiring board had the plated through-hole and had no patterning of the surface-layer conductor. The board had a dry film resist of 20 μm thick laminated on the surface thereof to form a negative pattern at a desired position. The surface-layer conductor was patterned to a desired shape by the cupric chloride etchant. The resist was removed. In turn, a resist was formed on that. A positive pattern was formed at a desired position. The positive pattern of the resist was filled with the via conductor therein by electroless copper plating. The resist was removed.

EMBODIMENT 42

The bilateral copper-clad glass-polyimide printed wiring board was replaced by a bilateral copper-clad glass BT resin printed wiring board manufactured by Mitsubishi Gas Chemical Co., Ltd. A multilayer wiring board was prepared in the same other conditions as the ones in embodiment 40.

EMBODIMENTS 43 TO 57

As to the epoxy resin composition of the multilayer wiring boards formed in ways similar to the one in embodiment 40, Table 3 shows compositions, hardening condition, and physical properties of the other epoxy resins prepared in embodiments 43 to 57.

EMBODIMENT 58

The epoxy resin composition in embodiment 40 was replaced by a liquid membrane which was prepared in a way that a benzocyclobutene dielectric, the dielectric was the oligomerized 1,2-ethenylenebis[bicyclo(4, 2, 0) octa-1, 3, 5-triene] obtained by the treatment of the monomer at 180° C. for five hours, was roll-coated on the mold at room temperature to liquid membrane. With use of the liquid membrane, a multilayer wiring board was prepared in the same other conditions as the ones in embodiment 40. Note that as the benzocyclobutene dielectric was a viscous liquid, it was filled in among the wiring conductors at room temperature without heating, and hardening was made at 250° C. for one hour.

EMBODIMENT 59

The epoxy resin composition in embodiment 40 was replaced by a film which was prepared in a process that a bismaleimide/cyanate-compound BT-3309T manufactured by Mitsubishi Gas Chemical Co., Ltd. was melted at 50° C. under hydrostatic pressure to film. With use of the film, a multilayer wiring board was prepared in the same other conditions as the ones in embodiment 40. Note that the film was melted at 50° C. before being filled in among the wiring conductors, and hardening was made at 150° C. for one hour.

EMBODIMENT 60

The epoxy resin composition in embodiment 40 was replaced by a filmed composition which was prepared in a process that the epoxy resin composition was kneaded with polyimide powder of 7 to 12 μm diameter of 200 wt % before being melted at 90° C. under hydrostatic pressure. With use of the filmed composition, a multilayer wiring board was prepared in the same other conditions as the ones in embodiment 40. Note that the filmed composition was melted at 70° C. before being filled in among the wiring conductors, and hardening was made at 180° C. for ten minutes under hydrostatic pressure and at 200° C. for one hour at normal pressure.

EMBODIMENT 61

The degree of the reduced pressure in embodiment 40 was made to 20 torr. After this, a multilayer wiring board was prepared in the same other conditions as the ones in embodiment 40.

EMBODIMENT 62

The degree of the reduced pressure in embodiment 40 was kept at 10 torr. With vertical compression pressure of 10 kgf/cm$^2$ exerted, the epoxy resin composition was filled in among the wiring conductors. After this, a multilayer wiring board was prepared in the same other conditions as the ones in embodiment 40.

EMBODIMENT 63

The degree of the reduced pressure in embodiment 40 was kept at 10 torr. With vertical compression pressure of 20 kgf/cm$^2$ exerted, the epoxy resin composition was filled in among the wiring conductors. After this, a multilayer wiring board was prepared in the same other conditions as the ones in embodiment 40.

EMBODIMENT 64

The vertical compression pressure in embodiment 40 was set to 5.5 kgf/cm$^2$, and the horizontal air pressure was set to 5 kgf/cm$^2$ until the epoxy resin composition was hardened. After this, a multilayer wiring board was prepared in the same other conditions as the ones in embodiment 40.

EMBODIMENT 65

The vertical compression pressure in embodiment 40 was set to 10 kgf/cm$^2$, and the horizontal air pressure was set to 8 kgf/cm$^2$ until the epoxy resin composition was hardened. After this, a multilayer wiring board was prepared in the same other conditions as the ones in embodiment 40.

EMBODIMENT 66

The vertical compression pressure in embodiment 40 was set to 25 kgf/cm$^2$, and the horizontal air pressure was set to 20 kgf/cm$^2$ until the epoxy resin composition was hardened. After this, a multilayer wiring board was prepared in the same other conditions as the ones in embodiment 40.

EMBODIMENT 67

The method of exposing the upper surface of the vertical via conductor covered with the insulation film was changed from the etching solution composed of potassium permanganate to the $O_2$ plasma ashing as in embodiment 1. A multilayer wiring board was prepared in the same other conditions as the ones in embodiment 40.

EMBODIMENT 68

The temperature of the mold was risen from 70° C. to 150° C. at a rate of 70° C. per minute under hydrostatic pressure before the mold was kept for 30 minutes, the mold was detached, and the fluoropolymer sheet was peeled off before the upper surface of the vertical via conductor covered with the insulation film was exposed by the etching solution composed of potassium permanganate. Further, heating was made at 220° C. at normal pressure for 60 minutes. After this, a multilayer wiring board was prepared in the same other conditions as the ones in embodiment 40.

EMBODIMENT 69

The uppermost horizontal wiring forming method in embodiment 40 was changed to the one described below. After this, a multilayer wiring board was prepared in the same other conditions as the ones in embodiment 40. That is, an electroless copper plating of 18 μm thick was formed on the vertical via conductor with exposed upper surface. In turn, a dry film resist was laminated on that. A negative pattern of the resist was formed at a desired position. The copper was etched by the cupric chloride etchant. The resist was removed. Thus, the uppermost horizontal wiring conductor was formed.

EMBODIMENT 70

As the base substrate was prepared a bilateral copper-clad glass-polyimide printed wiring board having a via conductor connected with conductors of inter-layer connection through-holes and/or patterned surface-layer conductors as in embodiment 40. In turn, a copper foil of 3 μm thick was formed on a stainless steel plate of 500 μm thick by electroplating. A surface of the conductor layer of the substrate and a copper foil surface on the stainless steel plate were black-oxide-treated at 95° C. for two minutes with a solution composed of sodium chlorite of 31 g/l, sodium hydroxide of 15 g/l, and sodium phosphate 12 g/l. In turn, the epoxy resin composition used in embodiment 40 was put in between the copper foil and the fluoropolymer sheet. The epoxy resin composition was melted at 70° C. under hydrostatic pressure as in embodiment 40. The fluoropolymer sheet was peeled off. The laminated matter of the stainless steel plate, the copper foil, and the epoxy resin composition were put on the wirings of both layer sides of the substrate. The laminated matter was put in the mold which was coated with a fluoropolymer and has a surface roughness less than 1 μm.

Then, the process was passed through similar steps in embodiment 40 to harden the epoxy resin composition. The stainless steel plate was peeled off. A dry film resist of 25 μm thick was aligned on the copper foil for the substrate before having grooves formed on a top of the vertical via conductor. A cupric chloride etchant was used to etching-remove the copper foil at bottoms of the grooves. The portions having the copper foil removed include portions in which the upper surfaces of the vertical via conductor were and were not exposed. The resist was removed. The insulation film was etched back by around 1 μm with the etching solution composed of potassium permanganate similar to the one in embodiment 40 until the upper surface of every via conductor was completely exposed out. The entire upper surface, including the upper surfaces of the vertical via conductors and the upper surface of the insulation layer around the vertical via conductor, had an electroless copper deposition film of 0.5 μm thick formed by using a catalyst and accelerator ($Sn^{4+}$-Pd system) available on the market and a cupric sulfate electroless deposition ($CuSO_4$-NaOH-HCHO-EDTA). After this, the structure comprising the horizontal conductor layer and the vertical via conductor was formed as in embodiment 40. Further, the process steps from the insulation film forming to the wiring layer forming were repeated again before the insulation film was formed. Finally, a wiring layer on an uppermost layer was formed. Thus, a multilayer wiring board was prepared as in FIG. 13. The horizontal wiring conductor formed was 50 μm wide, 18 μm high, and 100 μm minimum interval. The vertical via conductor formed was 50×50 μm wide and 18 μm high.

EMBODIMENT 71

A single surface of a copper foil of 3 μm thick formed on a stainless steel plate was black-oxide-treated. The epoxy resin composition used in embodiment 40 was melted to stick like film on the black-oxide-treated surface of the copper foil. The laminated matter was used to prepare a multilayer wiring board as in embodiment 70.

EMBODIMENT 72

A single surface of a copper foil of 5 μm thick formed on a stainless steel plate was mechanically polished. The epoxy resin composition used in embodiment 40 was melted to stick like film on the copper foil. The laminated substrate was used to prepare a multilayer wiring board as in embodiment 70.

EMBODIMENT 73

A copper foil of 5 μm thick a single surface of which was blackoxide-treated was used to prepare a multilayer wiring board as in embodiment 70.

EMBODIMENT 74

The bilateral copper-clad glass-polyimide printed wiring board of the structure in FIG. 2b having the inter-layer connection through-hole and the patterned surface-layer conductor was used. The gaps of the inter-layer connection through-hole and the patterned surface-layer conductor were filled with insulation film, and the both upper surfaces of the conductors were exposed as in embodiment 40. In turn, a resist was filmed on each surface to form a positive pattern for the via conductor. Grooves of the resist were filled with the via conductor by electroless copper plating. The resist was removed. The gaps among the via conductors were filled with insulation film as in embodiment 40. After this, the process steps for forming the wiring layer and forming the insulation film were made to form a multilayer wiring board as in embodiment 40.

EMBODIMENT 75

The bilateral copper-clad glass-polyimide printed wiring board of the structure in FIG. 2c having the inter-layer connection through-hole and having no patterning on the surface-layer conductor was used. The inter-layer connection through-hole was filled with insulation film therein, and the upper surface of the conductor was exposed as in embodiment 40. In turn, a resist was filmed on that to form a positive pattern for a via conductor. Grooves of the resist were filled with the via conductor by copper electroplating. The resist was removed. After this, a resist was filmed on that to form a negative pattern at a desired position on the surface-layer conductor. Patterning was made on the surface-layer conductor with a cupric chloride etchant. The resist was removed. After this, the processed substrate was used as a base substrate to form a multilayer wiring board as in embodiment 40.

EMBODIMENT 76

The bilateral copper-clad glass-polyimide printed wiring board of the structure in FIG. 2c having the inter-layer connection through-hole and having no patterning on the surface-layer conductor was used. The inter-layer connection through-hole was filled with insulation film therein, and the upper surface of the conductor was exposed as in embodiment 40. In turn, a resist was filmed on that to form a negative pattern at a desired position on the surface-layer conductor. Patterning was made on the surface-layer conductor with a cupric chloride etchant. The resist was removed. After this, a resist was filmed on that to form a positive pattern for the via conductor. Grooves of the resist were filled with the via conductor by electroless copper plating. The resist was removed. After this, the processed substrate was used as a base substrate to form a multilayer wiring board as in embodiment 40.

EMBODIMENT 77

The bilateral copper-clad glass-polyimide printed wiring board of the structure in FIG. 2c having the inter-layer connection through-hole and having no patterning on the surface-layer conductor was used. The inter-layer connection through-hole was filled with insulation film therein, and the upper surface of the conductor was exposed as in embodiment 40. In turn, a conductor of 18 μm thick was formed by electroless copper plating. In turn, a resist was filmed on that to form a negative pattern at a desired position on the surface-layer conductor. Patterning was made on the surface-layer conductor with a cupric chloride etchant. The resist was removed. After this, a resist was filmed on that to form a positive pattern for the via conductor. Grooves of the resist were filled with the via conductor by electroless copper plating. The resist was removed. After this, the processed substrate was used as a base substrate to form a multilayer wiring board as in embodiment 40.

EMBODIMENT 78

A bilateral metal cored copper-clad glass-polyimide printed wiring board having copper as core material in a structure shown in FIG. 2a was used to form a multilayer wiring board in a process similar to the one in embodiment 40.

As described above, the present invention comprises step 1 of forming the base substrate having at least one of the horizontal wiring conductor and the vertical via conductor as wiring layers on at least one of surfaces thereof; step 2 of putting the mold having the planar surface on the wiring layer side of the base substrate and supplying the solvent-free fluid polymer precursor into between the base substrate and the mold; step 3 of exhausting between the mold and the base substrate; step 4 of moving the mold toward the base substrate before filling gaps between at least adjacent ones of the conductors on the base substrate and if necessary, the through-holes of the printed wiring board with the solvent-free fluid polymer precursor; step 5 of applying the predetermined hydrostatic pressure to the solvent-free fluid polymer precursor; step 6 of hardening the solvent-free fluid polymer precursor at the predetermined hydrostatic pressure; step 7 of exposing an upper surface of the horizontal wiring conductor or the vertical via conductor; and step 8 of forming the wiring layer comprising at least one of another horizontal wiring conductor and another vertical via conductor connected with the horizontal wiring conductor and the vertical via conductor; wherein the steps 2 to 8 are made once or more times to form the multilayer.

The present invention can form the planar insulation film with the uniform film thickness and physical properties in the entire substrate at a time without deforming and destructing the conductor and without void and pinhole. The process, therefore, can be made simple so that the multilayer wiring board can be fabricated in a short time with high yield.

Also, the process for exposing the upper surface of the horizontal wiring conductor or the vertical via conductor with the upper surface covered with the insulation film is the process for etching back the insulation film in the wet etching or dry etching method. The upper surface of the conductor, therefore, can be exposed with the insulation film kept planar, and also the surface of the insulation film can be kept adhesive. Further, the conductor is polished to make the conductor height uniform with the surface of the conductor exposed a little. The polishing process, therefore, can be made very simply in a sort time. This allows fabrication of the multilayer wiring board having the connection reliability maintained in a short time.

The process for forming the conductive undercoat film in forming the wiring layer comprising at least one of another horizontal wiring conductor and another vertical via conductor connected with said horizontal wiring conductor and said vertical via conductor is not only made in the usual dry filming method and electroless plating step, but also in the step described below. The step of forming the conductive undercoat film connected with the vertical via conductor of the base substrate includes the step of forming the organic insulation film with the conductor foil that put in between the mold and the solvent-free fluid polymer precursor at the above-mentioned steps 2 to 6; the step of forming the positive pattern of the resist at the desired position of the conductor foil; the step of etching the conductor foil on the upper portion of the vertical via conductor with the mask of the pattern of the resist; the step of removal of the resist; the step of etching the insulation film on the upper portion of the vertical via conductor with the mask of the pattern of the conductor foil; and the step of electroless-plating on the entire surface of the matter. Further, the conductor foil and/or conductor surface contacting the insulation film is made rough. These steps can replace the usual problem of adhesive strength due to the anchor effect of the electroless plated film and the rough-surface insulation film by the problem of adhesive strength due to the anchor effect of the rough-surface conductor foil and the insulation film. The conductive undercoat film having high adhesive strength, thus, can be simply formed at a low cost. This allows fabrication of the multilayer wiring board having high adhesion of the insulation film with the conductor, high connection of the conductors together, and high reliability at a low cost in a short time.

Further, the present invention uses a general-purpose high resolution resist instead of the photosensitive insulating material. The grooves of the resist is filled with the conductor by plating. These allow the fine via and wiring to be formed of the thick conductor.

In addition, the above-described fabrication method can be applied to the both surfaces of the base substrate to decrease the number of steps and to shorten the lead time and to reduce the warp of the base substrate as well.

The present invention uses the solvent-free fluid polymer precursor containing at least one of the multifunctional epoxy resin composition, the compound having two or more maleimide moiety in each of molecules thereof or the composition containing the compound, the compound having two or more cyanate moiety in each of molecules thereof or the composition containing the compound, the compound having two or more benzocyclobutene moiety in each of molecules thereof or the composition containing the compound, or the mixture of two or more kinds of these compounds and compositions. The above-mentioned solvent-free fluid polymer precursor is cheaper and can be hardened and formed at a lower temperature than the usual polyimide. This allows fabrication of the high-density multilayer wiring board having high heat resistance, high mechanical characteristics, and high electrical characteristics at a low cost and at a high through-put in a short lead time. The low hardening temperature for the insulation film can apply the above-described fabrication method to the printed wiring board.

As described so far, the simplified process, the short lead time, the increased reliability, the high yield, and the low production cost allow fabrication of the high-density multilayer wiring board of high productivity in short time as a whole.

The above-described method of fabricating the multilayer wiring board can form an unusually high density multilayer wiring board in the field of printed wiring board.

The multilayer wiring board having the printed wiring board used for the base substrate is structured so that the printed wiring board having the conductor in the filled inter-layer connection through-hole and/or the patterned surface-layer conductor and the via conductor connected with the conductor has at least one of conductor pattern layers and inter-layer insulation film layers of organic polymer alternately formed on the single surface thereof or both surfaces thereof, the via conductor and the conductor pattern layers being electrically connected together, and the conductor pattern layers being electrically connected together. Further, the via conductor formed on the printed wiring board or the via conductor electrically connecting the conductor pattern layers together is made like the pillar. These are effective in that as there is no effect of the plated through-hole of the base printed wiring board, the thin-film multilayer wiring layer can be formed on that. Also, as there is no plated through-hole to be formed at the final stage, the wiring density of the thin-film multilayer wiring layer on the base substrate can be increased to a maximum limit. Further, it is possible to make the connection of the thin-film multilayer wiring layer on the base substrate with the inner conductor layer of the base substrate, the connection of the both surfaces of the base substrate, and the connection of the conductor layers without the plated through-hole at the final stage. Still further, as the shape of the via conductor is like the pillar, the surface area occupied by the via conductor including the land is made narrower than the conformal via so that the high density multilayer wiring can be made. At the same time, as the upper surface of the via conductor is planar, the next pillar-like via conductor can be formed on that. This means that the number of vias cannot be lost as no vias at two positions are used for connection of separated thin-film multilayer wiring layers. Also, the thermal via can be formed.

The effect described above is quantitatively calculated below. It is assumed that the grid interval of the ordinary printed wiring board having the inter-layer connections made by the through-holes and interstitial via holes is 1.27 mm. It is also assumed that the wiring density calculated with two wirings formed between the grids is 1 with the number of grids and the length of wiring taken into account. The thin-film multilayer wiring layers formed in the method of fabricating the multilayer wiring board of the present invention can have at least three wirings formed at the grid interval of 0.635 mm. Thus, the relative wiring density is higher than 3. This means that the number of signal layers of the ordinary printed wiring board of the same area can be made less than 1/3, or the area for the same number of signal layers can be made narrower than 1/3. The increased wiring density and the lowered fabrication cost are very effective. On the other hand, the build-up method has the relative wiring density of around 2. If the plated through-holes are formed at the final stage of fabrication, the wirings on that area are lost.

As described above, the method of fabricating the multilayer wiring board of the present invention is made free of the effect due to the plated through-holes. Also, the method can form the thin-film multilayer wiring layers of higher wiring density than the build-up process. Thus, for the multilayer wiring board, higher density and lower cost are accomplished.

What is claimed is:

1. A method of fabricating a multilayer wiring board, comprising the steps of:

1) forming a base substrate having at least one of a horizontal wiring conductor and a vertical via conductor as wiring layers on at least one of surfaces thereof;

2) putting a mold having a planar surface on a wiring layer side of said base substrate and supplying a solvent-free fluid polymer precursor into between said base substrate and said mold;

3) exhausting between said mold and said base substrate;

4) moving said mold toward said base substrate before filling gaps between at least adjacent ones of the conductors on said base substrate with said solvent-free fluid polymer precursor;

5) applying a hydrostatic pressure to said solvent-free fluid polymer precursor;

6) hardening said solvent-free fluid polymer precursor at said hydrostatic pressure;

7) exposing an upper surface of said horizontal wiring conductor or said vertical via conductor; and 8) forming a wiring layer comprising at least one of another horizontal wiring conductor and another vertical via conductor connected with said horizontal wiring conductor and said vertical via conductor;

wherein the steps 2) to 8) are of at least one set.

2. The method of fabricating the multilayer wiring board according to claim 1 wherein said base substrate is a board selected from the group consisting of a printed wiring board, a metal cored wiring board, and a ceramic wring board.

3. The method of fabricating the multilayer wiring board according to claim 1 wherein said wiring layer has at least a copper conductor.

4. The method of fabricating the multilayer wiring board according to claim i wherein the steps 1) to 8) are made at the same time on the both obverse and reverse surfaces of said base substrate.

5. The method of fabricating the multilayer wiring board according to claim 2 wherein said base substrate is the printed wiring board having a plated through-hole, a patterned surface-layer conductor, and a via conductor connected with at least one selected from the group consisting of the plated through-hole and the surface-layer conductor.

6. The method of fabricating the multilayer wiring board according to claim 2 wherein said base substrate is the printed wiring board having a plated through-hole and a patterned surface-layer conductor.

7. The method of fabricating the multilayer wiring board according to claim 2 wherein said base substrate is the printed wiring board having a plated through-hole and a surface-layer conductor to be patterned.

8. The method of fabricating the multilayer wiring board according to claim 5 wherein the method uses the printed wiring board having the plated through-hole and a surface-layer conductor to be patterned that is fabricated by a method including the steps of:

1') forming a positive pattern of a resist at a desired position;

2') filling the positive pattern of the resist with the via conductor before removal of the resist;

3') forming a negative pattern of a resist at a desired position; and

4') patterning the surface-layer conductor to a desired shape by etching before removal of the resist.

9. The method of fabricating the multilayer wiring board according to claim 1 wherein said solvent-free fluid polymer precursor is one selected from the group consisting of a film, a powder, and a membrane coated to said mold.

10. The method of fabricating the multilayer wiring board according to claim 1 wherein said solvent-free fluid polymer precursor is a membrane coated to at least the wiring layer on said base substrate.

11. The method of fabricating the multilayer wiring board according to claim 1 wherein at the step 3) of exhausting between said mold and said base substrate, a degree of vacuum is not higher than 20 torr.

12. The method of fabricating the multilayer wiring board according to claim 1 wherein at the step 4) of moving said mold toward said base substrate before filling gaps between at least adjacent ones of the conductors on said base substrate with said solvent-free fluid polymer precursor, said solvent-free fluid polymer precursor is heated to melt.

13. The method of fabricating the multilayer wiring board according to claim 1 wherein at the step 4) of moving said mold toward said base substrate before filling gaps between at least adjacent ones of the conductors on said base substrate with said solvent-free fluid polymer precursor, a pressure between said mold and said base substrate is decreased to move said mold toward said base substrate.

14. The method of fabricating the multilayer wiring board according to claim 1 wherein at the step 4), a vertical compression pressure is applied to said mold and said base substrate to move said mold toward said base substrate.

15. The method of fabricating the multilayer wiring board according to claim 14 wherein the vertical compression pressure is not higher than 30 kgf/cm$^2$.

16. The method of fabricating the multilayer wiring board according to claim 1 wherein at the steps 4) and 5), a vertical compression pressure and a horizontal compression gas pressure are applied to obtain the hydrostatic pressure.

17. The method of fabricating the multilayer wiring board according to claim 1 wherein the hydrostatic pressure is not higher than 20 kgf/cm$^2$.

18. The method of fabricating the multilayer wiring board according to claim 16 wherein the vertical compression pressure is made higher than or equal to the horizontal compression gas pressure.

19. The method of fabricating the multilayer wiring board according to claim 18 wherein a difference of the vertical compression pressure from the horizontal compression gas pressure is made not higher than 10 kgf/cm$^2$.

20. The method of fabricating the multilayer wiring board according to claim 1 wherein the step 6) has a multi-step hardening process, including a first hardening step of hardening with the hydrostatic pressure applied in said mold and a second hardening step of hardening with no hydrostatic pressure applied after release from the said mold.

21. The method of fabricating the multilayer wiring board according to claim 1 wherein the step 7) is made by a wet etching or a dry etching.

22. The method of fabricating the multilayer wiring board according to claim 21 wherein the wet etching is made with a solution of permanganate or a solution of chromate.

23. The method of fabricating the multilayer wiring board according to claim 21 wherein the dry etching is made with an $O_2$ plasma or a UV/ozone.

24. The method of fabricating the multilayer wiring board according to claim 1 wherein the step 7) is made while said solvent-free fluid polymer precursor is in an incomplete hardening state before the precursor is completely hardened.

25. The method of fabricating the multilayer wiring board according to claim 1, further comprising between the steps 7) and 8) an additional step of polishing to make a height of said horizontal wiring conductor or said vertical via conductor of which the upper surface is exposed uniform by way of at least one of a mechanical polishing and a chemical polishing.

26. The method of fabricating the multilayer wiring board according to claim 1 wherein the step 8) includes the steps of:

1') forming a conductive undercoat film connected with said vertical via conductor of the base substrate;

2') forming a positive pattern of a resist for said horizontal wiring conductor at a desired position on said conductive undercoat film;

3') filling the positive pattern of the resist with said horizontal wiring;

4') forming a positive pattern of a resist for said vertical via conductor at a desired position on said horizontal wiring conductor;

5') filling the positive pattern of the resist with said vertical via conductor;

6') removal of the two resist layers; and

7') etching unnecessary portions of said conductive undercoat film.

27. The method of fabricating the multilayer wiring board according to claim 1 wherein the step 8) includes the steps of:

1') forming a conductive undercoat film connected with said vertical via conductor of the base substrate;

2') forming a positive pattern of a resist for said horizontal wiring conductor at a desired position on said conductive undercoat film;

3') filling the positive pattern of the resist with said horizontal wiring;

4') removal of the resist; and

5') etching unnecessary portions of said conductive undercoat film.

28. The method of fabricating the multilayer wiring board according to claim 1 wherein the step 8) includes the steps of:

1') forming a conductive undercoat film connected with said vertical via conductor of the base substrate;

2') forming a conductor on said conductive undercoat film.

3') forming a negative pattern of a resist for said horizontal wiring conductor at a desired position on said conductor; and 4') patterning said conductor and said conductive undercoat film to desired shapes by etching before removal of the resist.

29. The method of fabricating the multilayer wiring board according to claim 1 wherein the step 8) includes the steps of:

1') forming a positive pattern of a resist for said vertical via conductor at a desired position on said horizontal wiring conductor of said base substrate; and 2') filling the positive pattern of the resist with said vertical via conductor before removal of the resist.

30. The method of fabricating the multilayer wiring board according to claim 1 wherein the step 8) includes the steps of:

1') forming a positive pattern of a resist for said vertical via conductor or said horizontal wiring at a desired position on a surface-layer conductor to be patterned of said base substrate;

2') filling the positive pattern of the resist with said vertical via conductor or said horizontal wiring before removal of the resist.

3') forming a negative pattern of a resist at a desired position; and

4') patterning said surface-layer conductor to a desired shape by etching before removal of the resist.

31. The method of fabricating the multilayer wiring board according to claim 1 wherein the step 8) includes the steps of:

1') forming a negative pattern of a resist at a desired position on a surface-layer conductor to be patterned of said base substrate;

2') patterning said surface-layer conductor to a desired shape by etching before removal of the resist.

3') forming a positive pattern of a resist for said vertical via conductor or said horizontal wiring at a desired position; and 4') filling the positive pattern of the resist with said vertical via conductor or said horizontal wiring before removal of the resist.

32. The method of fabricating the multilayer wiring board according to claim 1 wherein the step 8) includes the steps of:

1') forming a conductor for said horizontal wiring or said vertical via conductor on an entire surface of a surface-layer conductor to be patterned of said base substrate;

2') forming a negative pattern of a resist at a desired position; and

3') patterning said conductor to a desired shape by etching before removal of the resist.

33. The method of fabricating the multilayer wiring board according to claim 26 wherein the step of forming the conductive undercoat film connected with said vertical via conductor of the base substrate includes the steps of:

i) forming an organic insulation film with a conductor foil that put in between said mold and said solvent-free fluid polymer precursor at the steps 2) to 6) of claim 1;

ii) forming a positive pattern of a resist at a desired position of the conductor foil;

iii) etching the conductor foil on an upper portion of said vertical via conductor with a mask of the pattern of the resist before removal of the resist;

iv) etching the insulation film on the upper portion of said vertical via conductor with a mask of a pattern of the conductor foil; and v) electroless-plating on an entire surface of the matter.

34. The method of fabricating the multilayer wiring board according to claim 33, further comprising a step of using a conductor foil formed on a metal foil as the conductor foil and hardening said solvent-free fluid polymer precursor before peeling the metal foil.

35. The method of fabricating the multilayer wiring board according to claim 33, wherein a surface contacting the insulation film for the conductor foil or the conductor foil and the wiring layer comprising at least one of said horizontal wiring or said vertical via conductor is made rough before the insulation film is formed.

36. The method of fabricating the multilayer wiring board according to claim 26 wherein the step of forming the conductive undercoat film connected with said vertical via conductor of the base substrate is a dry filming step.

37. The method of fabricating the multilayer wiring board according to claim 26 wherein the step of forming the conductive undercoat film connected with said vertical via conductor of the base substrate is an electroless plating step.

38. The method of fabricating the multilayer wiring board according to claim 1 wherein said solvent-free fluid polymer precursor comprises one or more kinds of organic compound which can be fluid under at least one condition selected from the group consisting of a temperature not higher than a hardening initiation temperature and a pressure, or comprises a composition containing said compound.

39. The method of fabricating the multilayer wiring board according to claim 38 wherein said solvent-free fluid polymer precursor comprises an epoxy resin composition, a compound having two or more maleimide moiety in each of molecules thereof or a composition containing the compound, a compound having two or more cyanate moiety in each of molecules thereof or a composition containing the compound, a compound having two or more benzocyclobutene moiety in each of molecules thereof or a composition containing the compound, or a mixture of two or more kinds of these compounds and compositions.

40. The method of fabricating the multilayer wiring board according to any of claims 38 and 39 wherein said solvent-free fluid polymer precursor contains 1 to 300 wt % of at least one selected from the group consisting of an organic polymer powder and an organic polymer fiber said organic polymer powder and said organic polymer fiber having at least one property selected from the group consisting of a low dielectric constant, a low thermal expansion coefficient, and a high heat resistance.

41. The method of fabricating the multilayer wiring board according to claim 40 wherein said organic polymer powder and said organic polymer fiber are made of a polyimide.

42. The method of fabricating the multilayer wiring board according to claim 39 wherein said epoxy resin composition is made of a multifunctional epoxy resin and a multifunctional hardener.

43. The method of fabricating the multilayer wiring board according to claim 42 wherein said multifunctional epoxy resin is made of a compound having three or more epoxy groups and one selected from the group consisting of an aromatic ring and a heterocycle in a molecule thereof.

44. The method of fabricating the multilayer wiring board according to claim 43 wherein said multifunctional epoxy resin is made of a compound having a constitutional formula of

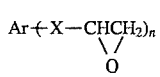 (1)

where Ar is one polyvalent molecular structure selected from among molecular structures represented by a constitutional formula of

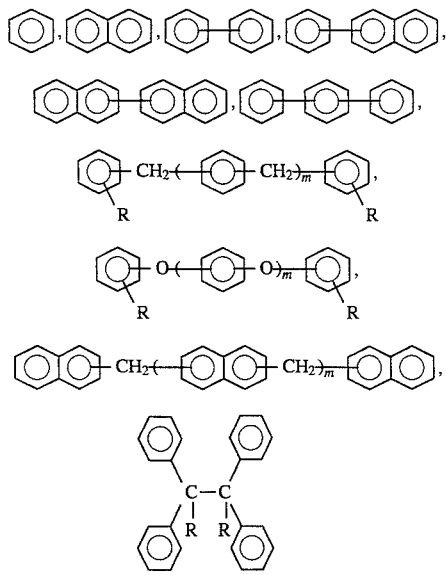

R; H or CH3
m; An integer of 0 to 4 where R is H or CH3, m is an integer of 0 to 4, and n is an integer of 3 to 6, and where X is at least one molecular structure selected from among molecular structures represented by a constitutional formula of

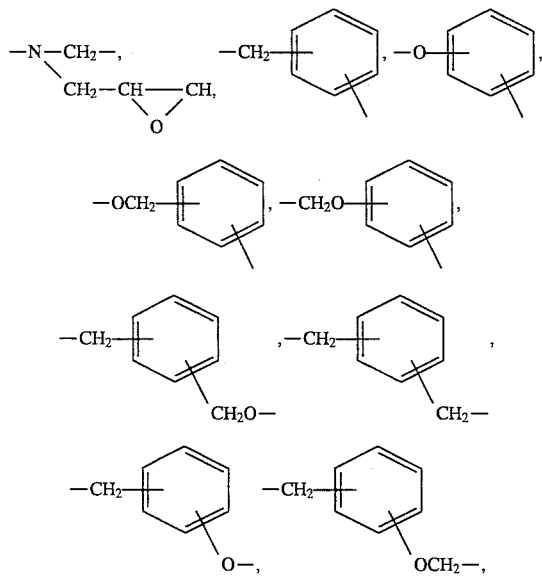

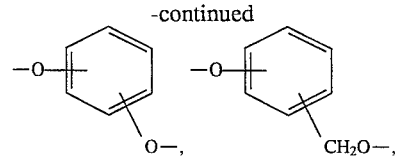

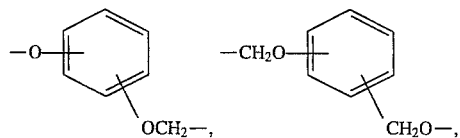

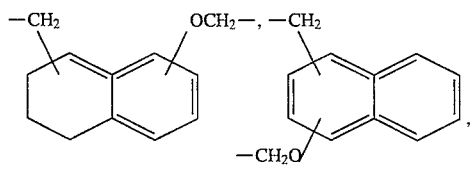

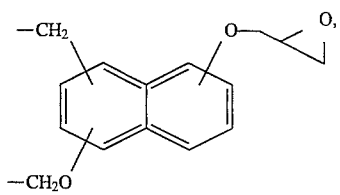

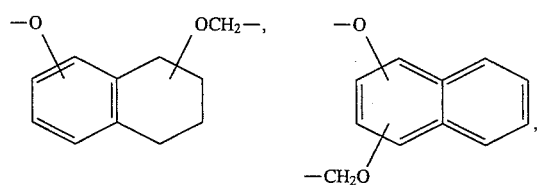

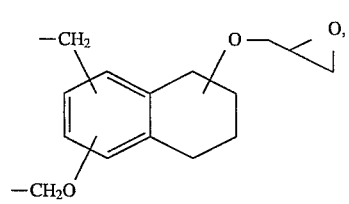

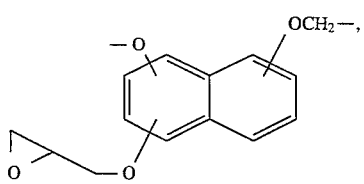

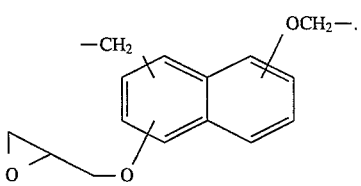

45. The method of fabricating the multilayer wiring board according to claim 42 wherein a major constituent of said multifunctional hardener is made of at least one compound selected from the group consisting of a group of a compound of six or more number of carbon atoms having two or more carboxylic anhydride groups, an aromatic amino compound having two or more amino groups and two or more aromatic rings, a heterocyclic compound having an amino group, a resin having a phenolic hydroxyl group, a heterocyclic compound having a phenolic hydroxyl group, a compound having three or more phenolic hydroxyl groups in a molecule thereof, and a compound having three or more aliphatic hydroxyl groups in a molecule thereof.

46. The method of fabricating the multilayer wiring board according to claim 45 wherein the hardener of multifunctional carboxylic anhydride is made of an alicyclic carboxylic anhydride, an aromatic carboxylic anhydride, or a mixture of at least one of these with a compound having one or two carboxylic anhydride groups.

47. The method of fabricating the multilayer wiring board according to claim 45 wherein said resin having the phenolic hydroxyl group contains at least the group consisting of a phenol resin, a cresol resin, and a pyrogallol resin.

48. The method of fabricating the multilayer wiring board according to claim 45 wherein the hardener of multifunctional aliphatic alcohol is a primary alcohol.

49. The method of fabricating the multilayer wiring board according to claim 27 wherein the step of forming the conductive undercoat film connected with said vertical via conductor of the base substrate includes the steps of:

i) forming an organic insulation film with a conductor foil that put in between said mold and said solvent-free fluid polymer precursor at the steps 2) to 6) of claim 1;

ii) forming a positive pattern of a resist at a desired position of the conductor foil;

iii) etching the conductor foil on an upper portion of said vertical via conductor with a mask of the pattern of the resist before removal of the resist;

iv) etching the insulation film on the upper portion of said vertical via conductor with a mask of a pattern of the conductor foil; and v) electroless-plating on an entire surface of the matter.

50. The method of fabricating the multilayer wiring board according to claim 28 wherein the step of forming the conductive undercoat film connected with said vertical via conductor of the base substrate includes the steps of:

i) forming an organic insulation film with a conductor foil that put in between said mold and said solvent-free fluid polymer precursor at the steps 2) to 6) of claim 1;

ii) forming a positive pattern of a resist at a desired position of the conductor foil;

iii) etching the conductor foil on an upper portion of said vertical via conductor with a mask of the pattern of the resist before removal of the resist;

iv) etching the insulation film on the upper portion of said vertical via conductor with a mask of a pattern of the conductor foil; and v) electroless-plating on an entire surface of the matter.

51. The method of fabricating the multilayer wiring board according to claim 27 wherein the step of forming the conductive undercoat film connected with said vertical via conductor of the base substrate is a dry filming step.

52. The method of fabricating the multilayer wiring board according to claim 28 wherein the step of forming the conductive undercoat film connected with said vertical via conductor of the base substrate is a dry filming step.

53. The method of fabricating the multilayer wiring board according to claim 27 wherein the step of forming the conductive undercoat film connected with said vertical via conductor of the base substrate is an electroless plating step.

54. The method of fabricating the multilayer wiring board according to claim 28 wherein the step of forming the conductive undercoat film connected with said vertical via conductor of the base substrate is an electroless plating step.

55. The method of fabricating the multilayer wiring board according to claim 39 wherein said solvent-free fluid polymer precursor contains 1 to 300 wt % of at least one selected from the group consisting of an organic polymer powder and an organic polymer fiber said organic polymer powder and said organic polymer fiber having at least one property selected from the group consisting of a low dielectric constant, a low thermal expansion coefficient, and a high heat resistance.

* * * * *